(12) United States Patent
Asazuma et al.

(10) Patent No.: US 11,022,659 B2
(45) Date of Patent: Jun. 1, 2021

(54) MAGNETIC SENSOR AND MAGNETIC-FIELD DETECTION DEVICE INCLUDING THE SAME

(71) Applicant: TDK CORPORATION, Tokyo (JP)

(72) Inventors: Yuki Asazuma, Tokyo (JP); Kei Tanabe, Tokyo (JP); Akihiro Unno, Tokyo (JP); Atsushi Matsuda, Tokyo (JP); Masashi Takahashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 376 days.

(21) Appl. No.: 15/776,234

(22) PCT Filed: Oct. 20, 2016

(86) PCT No.: PCT/JP2016/081103
§ 371 (c)(1),
(2) Date: May 15, 2018

(87) PCT Pub. No.: WO2017/086085
PCT Pub. Date: May 26, 2017

(65) Prior Publication Data
US 2020/0256932 A1 Aug. 13, 2020

(30) Foreign Application Priority Data
Nov. 20, 2015 (JP) .............................. JP2015-227853

(51) Int. Cl.
*G01R 33/09* (2006.01)
*H01L 43/08* (2006.01)
(Continued)

(52) U.S. Cl.
CPC ......... *G01R 33/09* (2013.01); *G01R 33/0005* (2013.01); *G01R 33/0011* (2013.01); *G01R 33/025* (2013.01); *H01L 43/08* (2013.01)

(58) Field of Classification Search
CPC .. G01R 33/09; G01R 33/025; G01R 33/0011; G01R 33/0005; G01R 33/093;
(Continued)

(56) References Cited

U.S. PATENT DOCUMENTS

| 2009/0284254 A1* | 11/2009 | Kasajima ........... G01R 33/0005 324/207.21 |
| 2013/0154618 A1* | 6/2013 | Heberle .................. H01L 29/82 324/207.2 |

(Continued)

FOREIGN PATENT DOCUMENTS

| CN | 102353911 A | 2/2012 |
| JP | H112671 A | 1/1999 |

(Continued)

*Primary Examiner* — Melissa J Koval
*Assistant Examiner* — Trung Q Nguyen
(74) *Attorney, Agent, or Firm* — Young Law Firm, P.C.

(57) ABSTRACT

An object of the present invention is to provide a magnetic sensor that can reduce influences of a disturbance magnetic field while ensuring high detection sensitivity. The magnetic sensor includes a sensor chip 20 having an element formation surface 20S on which magnetic detection elements MR3, MR4 are formed, a first magnetic member 31 placed on the element formation surface 20S and having a first height H1 as a height from the element formation surface 20S, and a second magnetic member 32 located on an opposite side of the magnetic detection elements MR3, MR4 to the first magnetic member 31 and having a second height H2 lower than the first height H1. According to the present invention, because the height H2 of the second magnetic member 32 is lower than that of the first magnetic member 31, a detection magnetic field attracted to the second magnetic member 32 can be reduced while a disturbance magnetic field is shielded by the second magnetic member 32.

(Continued)

Accordingly, influences of the disturbance magnetic field can be reduced while high detection sensitivity is ensured.

17 Claims, 22 Drawing Sheets

(51) Int. Cl.
*G01R 33/00* (2006.01)
*G01R 33/025* (2006.01)
(58) Field of Classification Search
CPC ..... H01L 43/08; H01F 13/003; H01F 7/0278; H01F 10/325
USPC ........ 324/200, 207.2–207.23, 205, 210, 219, 324/228, 244, 252, 262, 500, 750.12, 324/750.21, 754.17, 754.29
See application file for complete search history.

(56) References Cited

U.S. PATENT DOCUMENTS

2015/0177337 A1* 6/2015 Yamashita .............. H01L 43/08
324/252
2016/0202329 A1 7/2016 Paci
2018/0321332 A1* 11/2018 Tanabe ................. G01R 33/025

FOREIGN PATENT DOCUMENTS

| JP | 2009276159 A | 11/2009 |
| JP | 2013172040 A | 9/2013 |

* cited by examiner

MAGNETIC SENSOR AND MAGNETIC-FIELD DETECTION DEVICE INCLUDING THE SAME

TECHNICAL FIELD

The present invention relates to a magnetic sensor and a magnetic-field detection device including the same, and more particularly relates to a magnetic sensor that can reduce influences of a disturbance magnetic field while ensuring high detection sensitivity and a magnetic-field detection device including the magnetic sensor.

BACKGROUND ART

A magnetic sensor using a magnetoresistive sensor or the like is widely used in an ammeter or a magnetic encoder. In the magnetic sensor, there is a case where a magnetic member for collecting magnetic fluxes is placed on a sensor chip (see Patent Document 1). When a magnetic member for collecting magnetic fluxes is placed on the sensor chip, sensitivity to a magnetic field in a vertical direction can be enhanced.

CITATION LIST

Patent Document

Patent Document 1: Japanese Patent Application Laid-open No. 2009-276159

SUMMARY OF INVENTION

Technical Problem to be Solved by Invention

However, a sensor chip may be exposed to a disturbance magnetic field being noise, as well as to a detection magnetic field as a detection target. Therefore, there is a risk that detection sensitivity is lowered by the disturbance magnetic field. In order to reduce the influences of a disturbance magnetic field, there is conceived a method for shielding the disturbance magnetic field by placing another magnetic member on or near the sensor chip.

Studies on this method conducted by the present inventors show that a detection magnetic field that is supposed to be detected is attracted to the shielding magnetic member, which may result in lower detection sensitivity, depending on the size or position of the shielding magnetic member.

It is therefore an object of the present invention to provide a magnetic sensor that can reduce influences of a disturbance magnetic field while ensuring high detection sensitivity, and a magnetic-field detection device including the magnetic sensor.

Means for Solving Problem

A magnetic sensor according to the present invention comprises a sensor chip having an element formation surface on which a first magnetic detection element is formed, a first magnetic member placed on the element formation surface and having a first height as a height from the element formation surface, and a second magnetic member located on an opposite side of the first magnetic detection element to the first magnetic member and having a second height lower than the first height.

According to the present invention, because the height of the second magnetic member is lower than that of the first magnetic member, a detection magnetic field attracted to the second magnetic member can be reduced while a disturbance magnetic field is shielded by the second magnetic member. Accordingly, influences of the disturbance magnetic field can be reduced while high detection sensitivity is ensured.

In the present invention, it is preferable that the second magnetic member is placed on the element formation surface. This configuration can fix a relative positional relation between the first magnetic member and the second magnetic member, and between the first magnetic detection element and the second magnetic member.

In the present invention, it is preferable that a second magnetic detection element is further formed on the element formation surface of the sensor chip and that the first magnetic member is placed between the first magnetic detection element and the second magnetic detection element. Accordingly, the intensity of a detection magnetic field can be detected based on a difference between an output signal from the first magnetic detection element and an output signal from the second magnetic detection element.

In the present invention, it is preferable that the first and second magnetic members are larger in a size in a length direction than in a size in a width direction, where the width direction is an array direction of the first and second magnetic detection elements and the length direction is parallel to the element formation surface and orthogonal to the width direction. This configuration can broaden a detection range for a magnetic field in a vertical direction. Further, the size of the magnetic sensor can be reduced.

In this case, the size in the length direction of at least one of the first and second magnetic members can be larger than the size in the length direction of the sensor chip. The sizes in the length direction of the first and second magnetic members can be different from each other. Further, the sizes in the width direction of the first and second magnetic members can be different from each other. Furthermore, the second magnetic member can be divided in the length direction into a plurality of parts.

In the present invention, a distance in the width direction between the first magnetic detection element and the second magnetic member can be larger than a distance in the width direction between the first magnetic detection element and the first magnetic member. This configuration can reduce a detection magnetic field attracted to the second magnetic member. Alternatively, a distance in the width direction between the first magnetic detection element and the first magnetic member and a distance in the width direction between the first magnetic detection element and the second magnetic member can be equal to each other. This configuration can downsize the sensor chip.

It is preferable that the magnetic sensor according to the present invention detects a residual magnetic field in a magnetic medium moving in the width direction relative to the sensor chip. This configuration enables the magnetic sensor according to the present invention to be applied to, for example, a banknote identification device.

It is preferable that the magnetic sensor according to the present invention further comprises a third magnetic member that is located on an opposite side of the second magnetic detection element to the first magnetic member and that has a third height lower than the first height. This configuration enables a disturbance magnetic field to be shielded by the second and third magnetic members, and therefore influences of the disturbance magnetic field can be reduced more.

It is preferable that the magnetic sensor according to the present invention further comprises a protection member that fills a space between the first magnetic member and the second magnetic member, seals the first and second magnetic members, and has a lower permeability than that of the first and second magnetic members. Accordingly, the first and second magnetic members can be protected without lowering detection sensitivity.

A magnetic-field detection device according to the present invention comprises the magnetic sensor described above and a signal processing circuit that extracts a predetermined frequency component from an output signal of the magnetic sensor.

According to the present invention, disturbance magnetic field components such as terrestrial magnetism can be eliminated without using a plurality of magnetic sensors.

It is preferable that the magnetic-field detection device according to the present invention further comprises a magnetic-field generation circuit that applies a cancel magnetic field to the magnetic sensor based on a cancel signal generated based on the predetermined frequency component. Accordingly, a detection magnetic field can be detected in a state where a disturbance magnetic field such as terrestrial magnetism has been canceled.

Advantageous Effects of Invention

According to the present invention, it is possible to provide a magnetic sensor that can reduce influences of a disturbance magnetic field while ensuring high detection sensitivity and a magnetic-field detection device including the magnetic sensor.

MODE FOR CARRYING OUT THE INVENTION

Preferred embodiments of the present invention will now be explained in detail with reference to the drawings.

Figure 1:
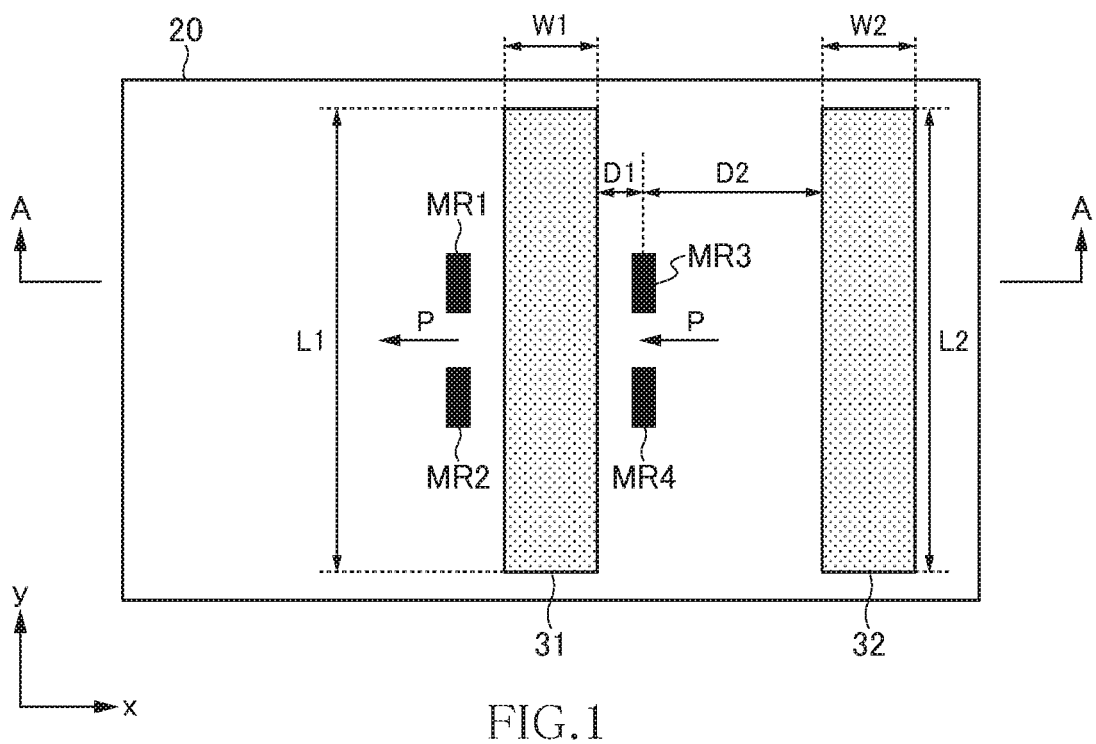
FIG. 1 is a schematic plan view illustrating a configuration of a magnetic sensor 10A according to a first embodiment of the present invention.
Figure 2:
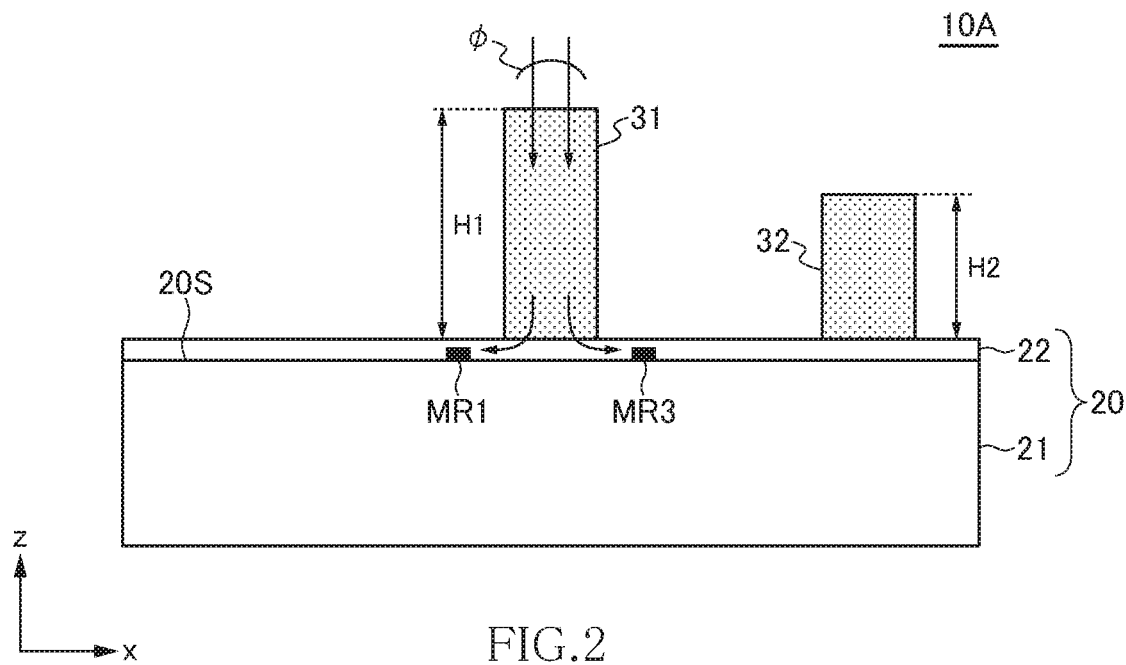
FIG. 2 is a schematic sectional view along a line A-A illustrated in FIG. 1.
Figure 3:
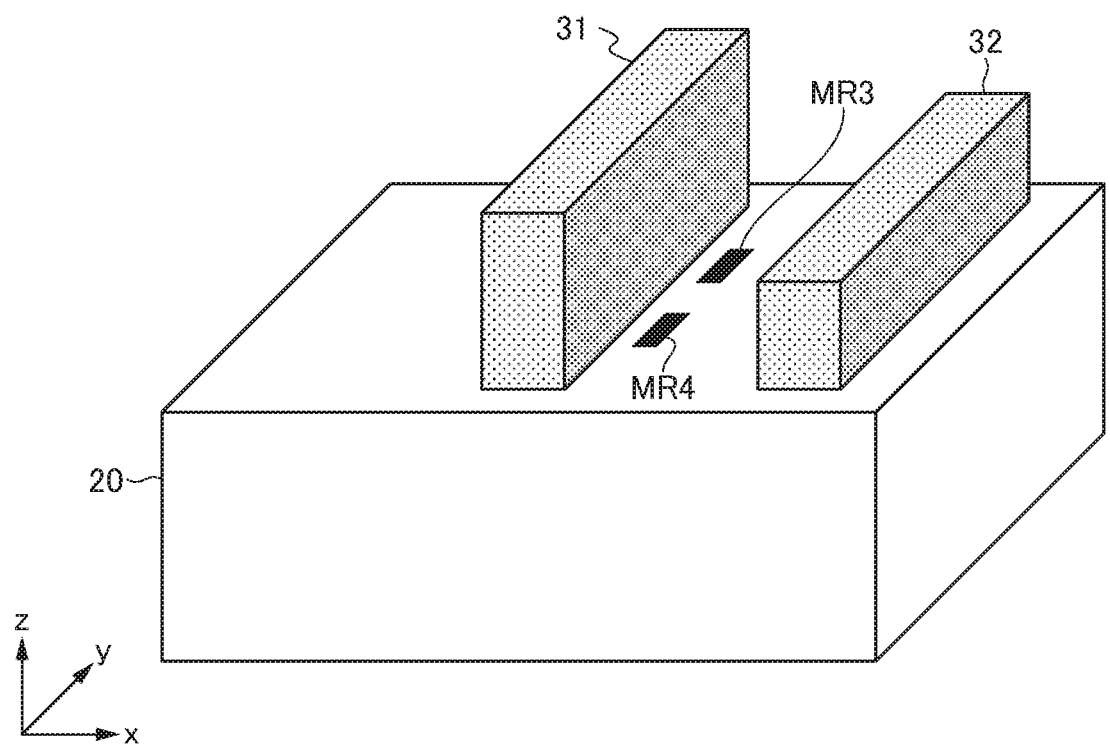
FIG. 3 is a schematic perspective view illustrating an external appearance of the magnetic sensor 10A.

FIG. 1 is a schematic plan view illustrating a configuration of a magnetic sensor 10A according to the first embodiment of the present invention, and FIG. 2 is a schematic sectional view along a line A-A illustrated in FIG. 1. FIG. 3 is a schematic perspective view illustrating an external appearance of the magnetic sensor 10A.

As illustrated in FIGS. 1 to 3, the magnetic sensor 10A according to the present embodiment includes a sensor chip 20, and first and second magnetic members 31 and 32.

The sensor chip 20 has a substantially cuboid shape and has a substrate 21 on which magnetic detection elements MR1 to MR4 are formed and an insulating layer 22 that covers an element formation surface 20S. The element formation surface 20S forms an xy plane. It is preferable to use a magnetoresistive sensor (an MR sensor) having an electrical resistance that changes depending on the orientation of a magnetic field as the magnetic detection elements MR1 to MR4. Magnetization fixing directions of the magnetic detection elements MR1 to MR4 are all arranged to be the same direction indicated by an arrow P in FIG. 1.

The first and second magnetic members 31 and 32 are mounted on the element formation surface 20S of the sensor chip 20 with the insulating layer 22 interposed therebetween. The first and second magnetic members 31 and 32 are blocks made of a high-permeability material such as ferrite. The first magnetic member 31 is located between the magnetic detection elements MR1 and MR2 and the magnetic detection elements MR3 and MR4. In contrast thereto, the second magnetic member 32 is provided on the opposite side of the magnetic detection elements MR3 and MR4 to the first magnetic member 31.

As illustrated in FIG. 2, the first magnetic member 31 functions to collect magnetic fluxes ø in a vertical direction (z direction), and the magnetic fluxes collected by the first magnetic member 31 are distributed to right and left in the x direction substantially equally. Accordingly, the vertical magnetic fluxes ø are provided to the magnetic detection elements MR1 to MR4 substantially equally. Meanwhile, the second magnetic member 32 functions to shield a disturbance magnetic field. While the second magnetic member 32 is located on the element formation surface 20S of the sensor chip 20 in the present embodiment, the second magnetic member 32 can be fixed to other members than the sensor chip 20 as long as a relative positional relation with the magnetic detection elements MR1 to MR4 is maintained.

As illustrated in FIGS. 1 and 2, the first magnetic member 31 has a width W1 in the x direction, a length L1 in the y direction, and a height H1 in the z direction. The second magnetic member 32 has a width W2 in the x direction, a length L2 in the y direction, and a height H2 in the z direction. The x direction in this example is a width direction defined by an array direction of the magnetic detection element MR1 and the magnetic detection element M3 (an array direction of the magnetic detection element MR2 and the magnetic detection element MR4). The y direction is a length direction parallel to the element formation surface 20S and orthogonal to the x direction. The z direction is a height direction perpendicular to the element formation surface 20S.

In the present embodiment,
W1=W2,
L1=L2, and
H1>H2.
That is, while the first magnetic member 31 and the second magnetic member 32 are equal to each other in the width (in the x direction) and the length (in the y direction), the second magnetic member 32 is lower than the first magnetic member 31 in the height (in the direction). With this configuration, the magnetic fluxes ø to be detected are less likely to be attracted to the second magnetic member 32 than in a case where the heights of the first magnetic member 31 and the second magnetic member 32 are the same (in a case where H1=H2). Accordingly, influences of a disturbance magnetic field can be reduced by the second magnetic member 32 while high detection sensitivity is ensured.

Because the first magnetic member 31 is larger in the length L1 than in the width W1, a detection range of the magnetic fluxes in the z direction can be broadened in the length direction (the y direction). Besides, because the width W1 is small, the distance between the magnetic detection elements MR1 and MR2 and the magnetic detection elements MR3 and MR4 can be reduced and thus the device can be downsized.

Further, a distance D2 in the x direction between the magnetic detection elements MR3 and MR4 and the second magnetic member 32 is larger than a distance D1 in the x direction between the magnetic detection elements MR3 and MR4 and the first magnetic member 31 in the present embodiment. Accordingly, the magnetic fluxes ø to be detected become less likely to be attracted to the second magnetic member 32 even when a detection target object is located near the first magnetic member 31.

Figure 4:
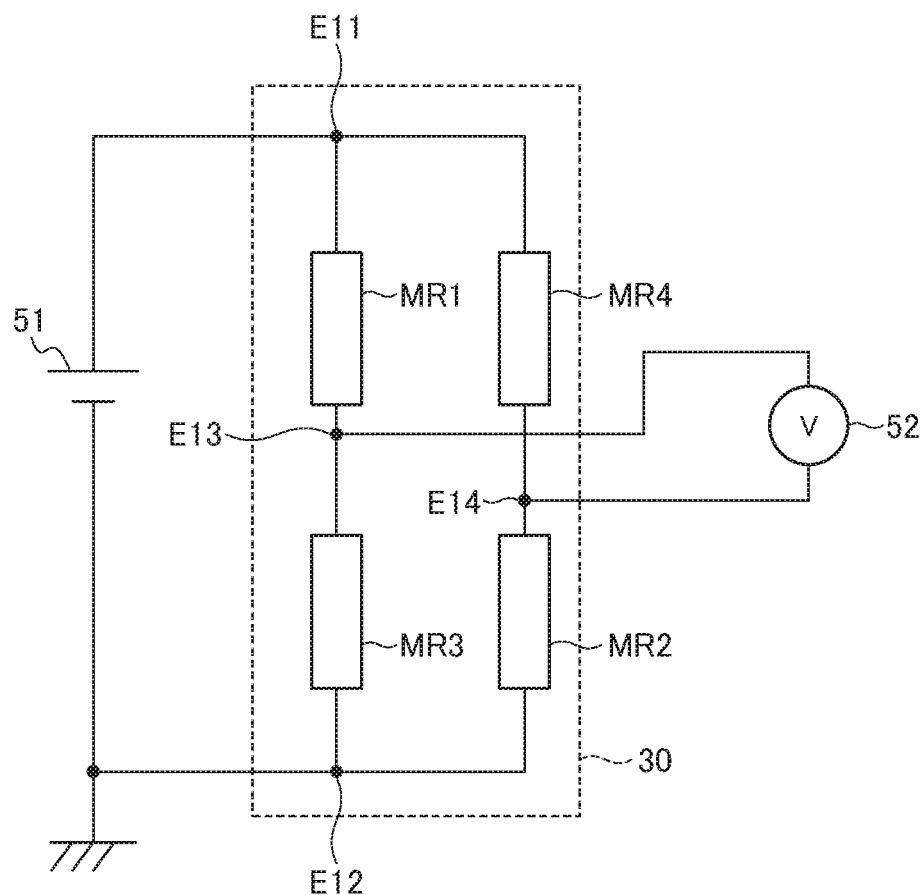
FIG. 4 is a circuit diagram for explaining a connection relation of the magnetic detection elements MR1 to MR4.

FIG. 4 is a circuit diagram for explaining a connection relation of the magnetic detection elements MR1 to MR4.

As illustrated in FIG. 4, the magnetic detection element MR1 is connected between terminal electrodes E11 and E13, the magnetic detection element MR2 is connected between terminal electrodes E12 and E14, the magnetic detection element MR3 is connected between the terminal electrodes E12 and E13, and the magnetic detection element MR4 is connected between the terminal electrodes E11 and E14. A predetermined voltage is applied between the terminal electrodes E11 and E12 by a constant-voltage source 51. A voltage detection circuit 52 is connected between the terminal electrodes E13 and E14, and the level of an output voltage appearing between the terminal electrodes E13 and E14 is detected by the voltage detection circuit 52.

The magnetic detection elements MR1 and MR2 are placed on the left side (a negative side in the x direction) of the first magnetic member 31 in a planar view and the magnetic detection elements MR3 and MR4 are placed on the right side (a positive side in the x direction) of the first magnetic member 31 in the planar view. Therefore, the magnetic detection elements MR1 to MR4 form a differential bridge circuit and changes in the electrical resistances of the magnetic detection elements MR1 to MR4 according to magnetic flux densities can be detected with high sensitivity.

Specifically, the magnetic fluxes ø in the z direction illustrated in FIG. 2 pass through the first magnetic member 31 in the z direction and then moves around both sides thereof in the x direction to return to a generation source of the magnetic fluxes. At this time, a difference occurs between a change amount of the resistance of the magnetic detection elements MR1 and MR2 located on the left side of the first magnetic member 31 in the planar view and a change amount of the resistance of the magnetic detection elements MR3 and MR4 located on the right side of the first magnetic member 31 in the planar view because the magnetic detection elements MR1 to MR4 all have the same magnetization fixing direction. This difference is amplified by the differential bridge circuit illustrated in FIG. 4 and is detected by the voltage detection circuit 52.

Figure 5:
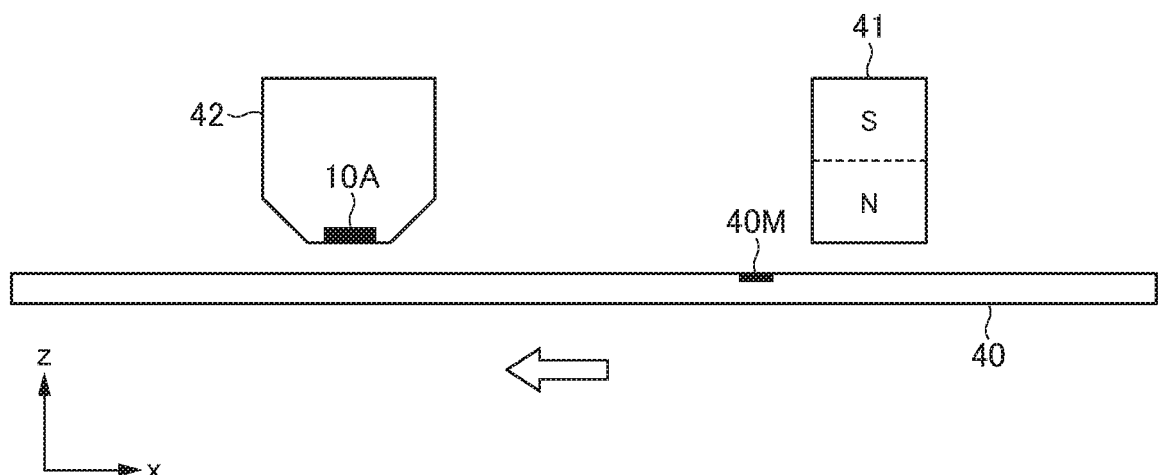
FIG. 5 is a schematic diagram illustrating an example of a magnetic-field detection device using the magnetic sensor 10A.

FIG. 5 is a schematic diagram illustrating an example of a magnetic-field detection device using the magnetic sensor 10A.

The magnetic-field detection device illustrated in FIG. 5 is a device that detects a soft magnetic member 40M included in a magnetic medium 40, and includes a permanent magnet 41 magnetizing the soft magnetic member 40M, and a sensor module 42 including the magnetic sensor 10A. The magnetic medium 40 is carried in the x direction by a carrying mechanism (not illustrated). In the case of a banknote identification device, a banknote corresponds to the magnetic medium 40. A configuration to scan the permanent magnet 41 and the sensor module 42 in the x direction can be employed instead of carrying the magnetic medium 40 in the x direction.

In the magnetic-field detection device having the configuration described above, the soft magnetic member 40M is first magnetized by the permanent magnet 41 and a magnetic component is detected when the magnetized soft magnetic member 40M passes through the sensor module 42.

Figure 6A:
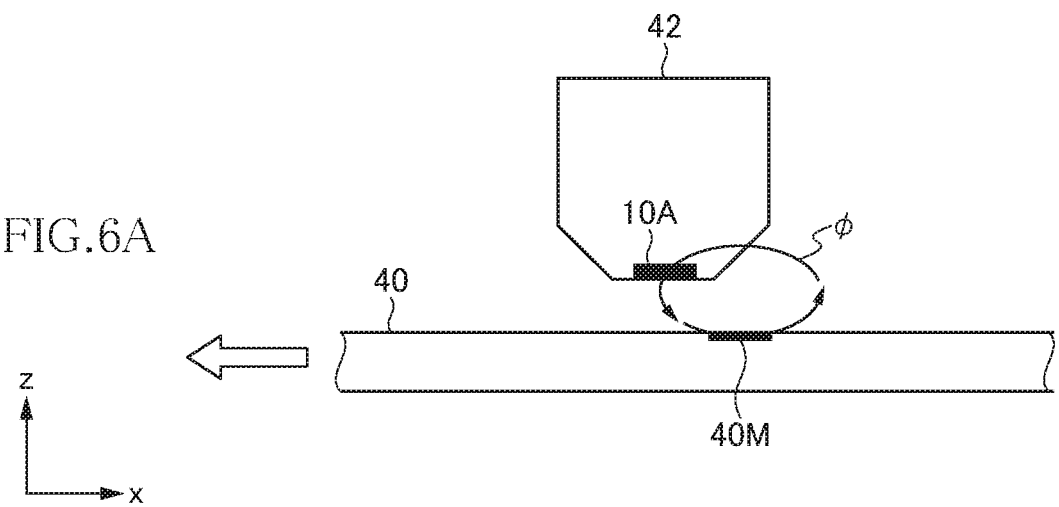
FIG. 6 is a schematic diagram illustrating a state immediately before and after the soft magnetic member 40M passes through the sensor module 42.
Figure 6B:
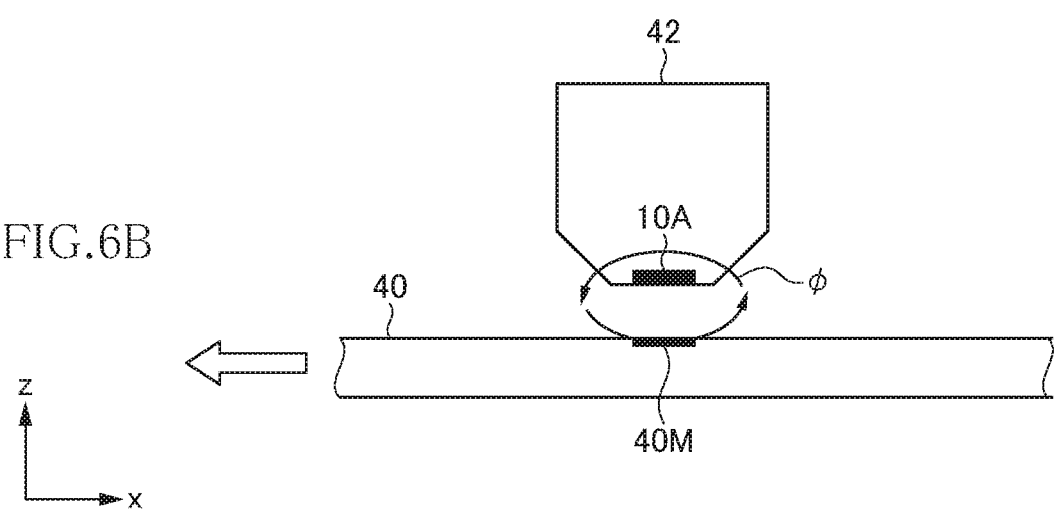
Figure 6C:
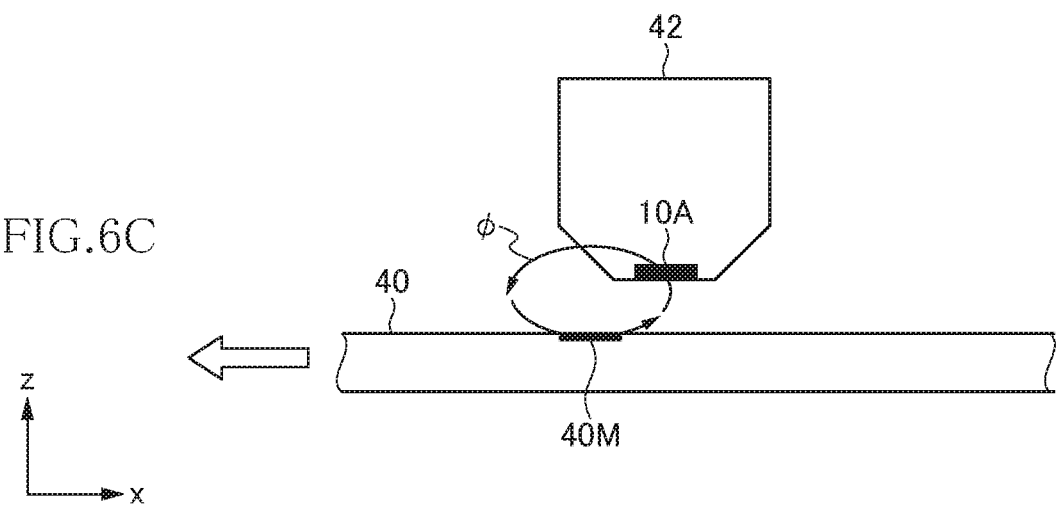

FIG. 6A illustrates a state immediately before the soft magnetic member 40M passes through the sensor module 42. At this timing, the magnetic fluxes ø from the soft magnetic member 40M being the generation source are in a perpendicular direction to the magnetic sensor 10A (the z direction). Therefore, the magnetic fluxes ø are detected by the magnetic detection elements MR1 to MR4 included in the magnetic sensor 10A and a positive output voltage is generated, for example. On the other hand, at a timing when the soft magnetic member 40M is located immediately below the sensor module 42 as illustrated in FIG. 6B, the magnetic fluxes ø from the soft magnetic member 40M as the generation source are in a horizontal direction to the magnetic sensor 10A (the x direction). In this case, there are no magnetic fluxes in the perpendicular direction to the magnetic sensor 10A (the z direction) and thus the output voltage from the magnetic detection elements MR1 to MR4 becomes almost zero. At a timing immediately after the soft magnetic member 40M has passed the sensor module 42 as illustrated in FIG. 6C, the magnetic fluxes ø from the soft magnetic member 40M as the generation source become in the perpendicular direction to the magnetic sensor 10A (the z direction) again. Accordingly, the magnetic fluxes ø are detected by the magnetic detection elements MR1 to MR4 included in the magnetic sensor 10A and a negative output voltage is generated, for example. This mechanism detects a residual magnetic field of the magnetic medium 40 moving in the x direction.

Figure 7:
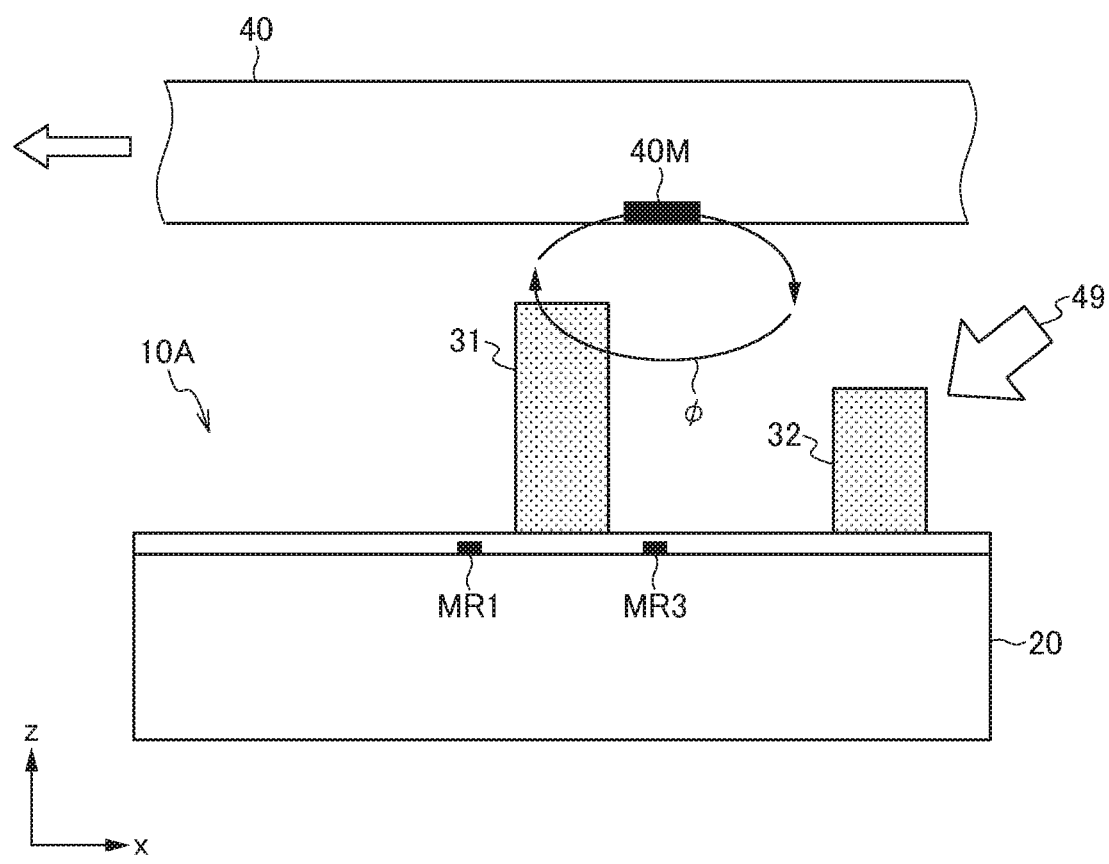
FIG. 7 is a schematic diagram for explaining a state where a disturbance magnetic field 49 is shielded.

However, not only the magnetic fluxes from the soft magnetic member 40M as the generation source enter the magnetic sensor 10A but magnetic fluxes caused by a disturbance magnetic field also enter the magnetic sensor 10A. For example, when the magnetic-field detection device is used in a banknote identification device, components such as a motor for carrying banknotes become the generation source of a disturbance magnetic field. In order to shield the disturbance magnetic field, the second magnetic member 32 is provided in the magnetic sensor 10A according to the present embodiment. Because at least a part of a disturbance magnetic field 49 is accordingly shielded by the second magnetic member 32 as illustrated in FIG. 7, the disturbance magnetic field 49 entering the magnetic detection elements MR1 to MR4 can be reduced as compared to a conventional technique. Particularly, in a banknote identification device, a disturbance magnetic field is likely to enter from the x direction being a banknote carrying direction and thus the magnetic sensor 10A according to the present embodiment is particularly suitable to be used in such application.

Besides, because the second magnetic member 32 is lower than the first magnetic member 31 in the height in the z direction, the magnetic fluxes ø that are supposed to be detected are less likely to be taken by second magnetic member 32. Accordingly, reduction of detection sensitivity due to the second magnetic member 32 can be suppressed.

Other embodiments of the present invention are described below.

Figure 8:
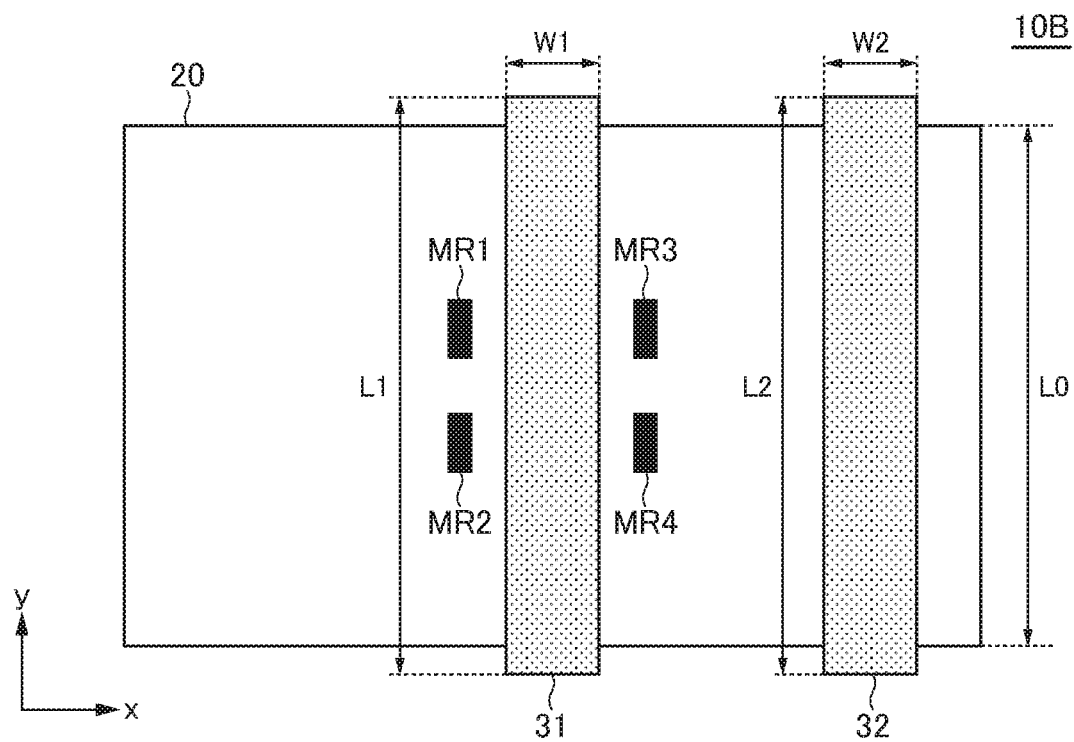
FIG. 8 is a schematic plan view illustrating a configuration of a magnetic sensor 10B according to a second embodiment of the present invention.
Figure 9:
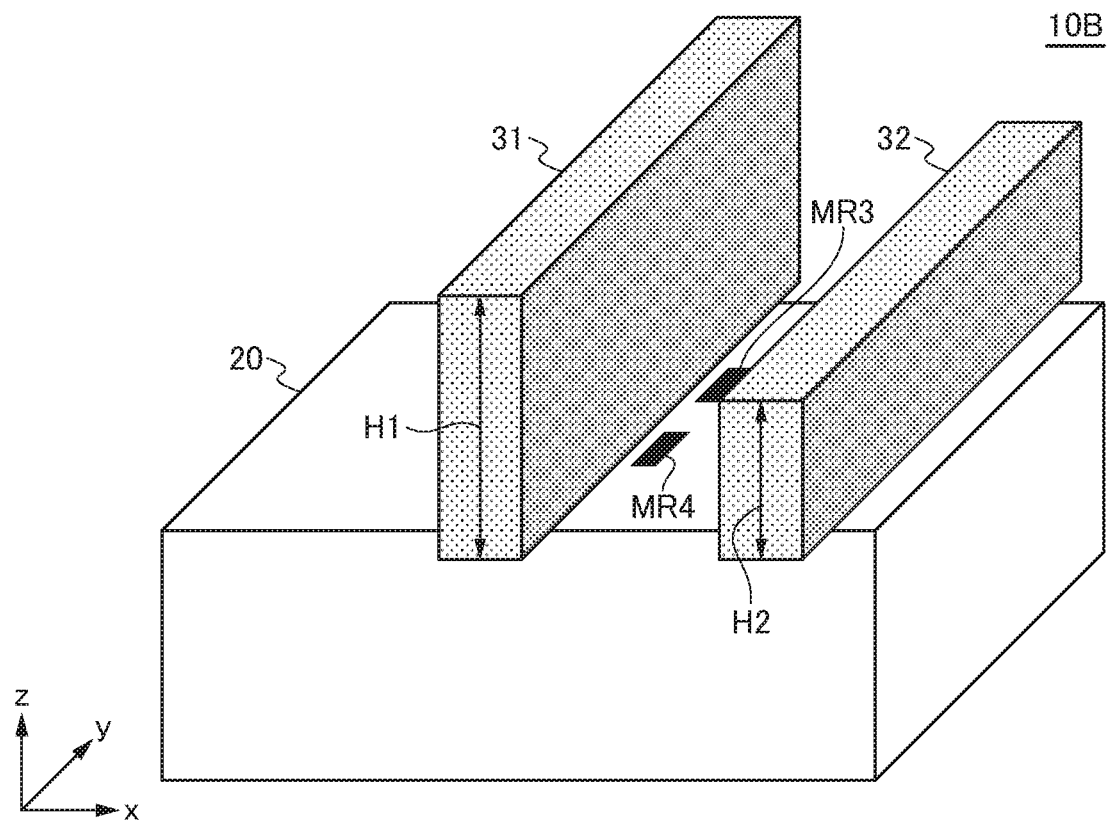
FIG. 9 is a schematic perspective view illustrating an external appearance of the magnetic sensor 10B.

FIG. 8 is a schematic plan view illustrating a configuration of a magnetic sensor 10B according to the second embodiment of the present invention, and FIG. 9 is a schematic perspective view illustrating an external appearance of the magnetic sensor 10B.

The magnetic sensor 10B according to the second embodiment is different from the magnetic sensor 10A according to the first embodiment illustrated in FIGS. 1 to 3 in that the lengths L1 and L2 in the y direction of the first and second magnetic members 31 and 32 are larger than a length L0 in the y direction of the sensor chip 20.

That is,

L0<L1=L2.

Because other features of the magnetic sensor 10B are identical to those of the magnetic sensor 10A according to the first embodiment, the same elements are denoted by the same reference characters and redundant explanations thereof will be omitted.

With the magnetic sensor 10B according to the present embodiment, more magnetic fluxes ø in the vertical direction can be collected and therefore higher detection sensitivity can be obtained.

Figure 10:
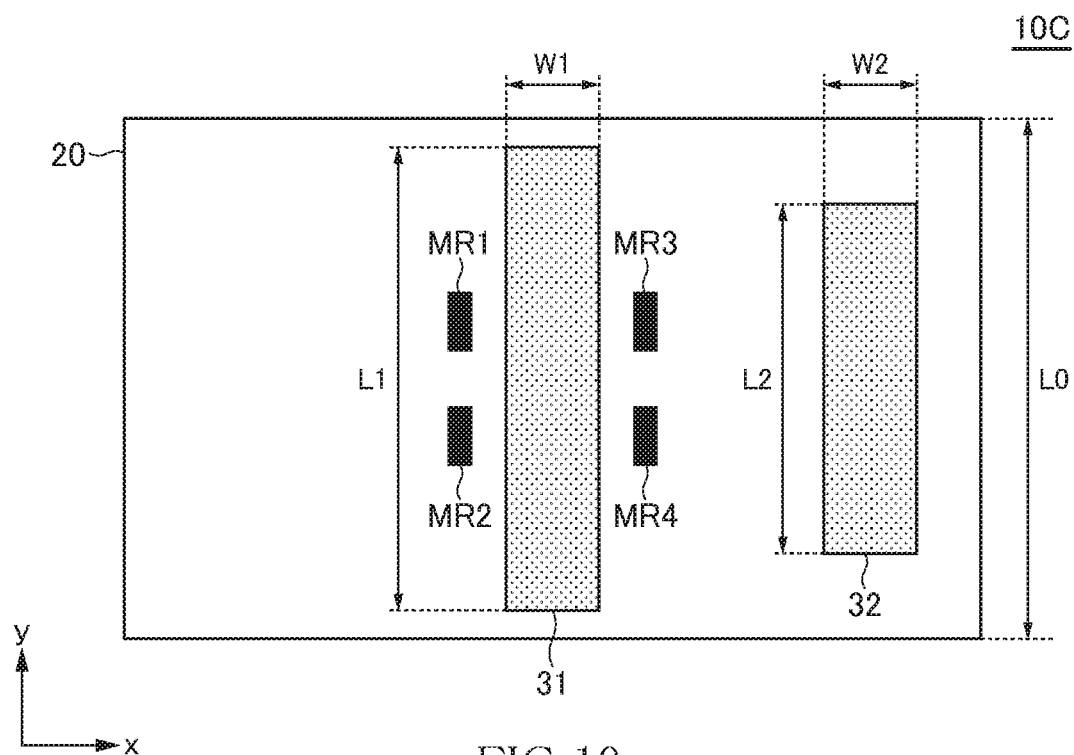
FIG. 10 is a schematic plan view illustrating a configuration of a magnetic sensor 10C according to a third embodiment of the present invention.
Figure 11:
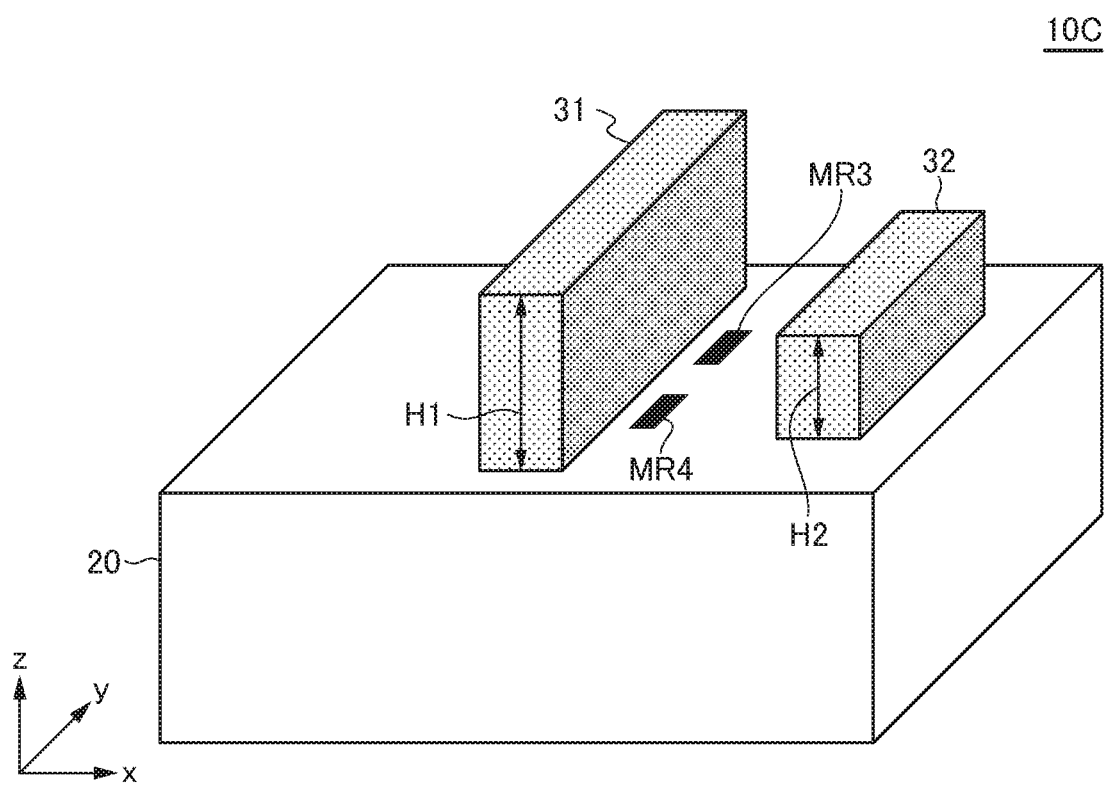
FIG. 11 is a schematic perspective view illustrating an external appearance of the magnetic sensor 10C.

FIG. 10 is a schematic plan view illustrating a configuration of a magnetic sensor 10C according to the third embodiment of the present invention, and FIG. 11 is a schematic perspective view illustrating an external appearance of the magnetic sensor 10C.

The magnetic sensor 10C according to the third embodiment is different from the magnetic sensor 10A according to the first embodiment illustrated in FIGS. 1 to 3 in that the length L2 in the y direction of the second magnetic member 32 is smaller than the length L1 in the y direction of the first magnetic member 31. That is,

L1>L2.

Because other features of the magnetic sensor 10C are identical to those of the magnetic sensor 10A according to the first embodiment, the same elements are denoted by the same reference characters and redundant explanations thereof will be omitted.

With the magnetic sensor 10C according to the present embodiment, less magnetic fluxes ø are attracted to the second magnetic member 32 and therefore reduction of detection sensitivity due to the second magnetic member 32 can be suppressed more. Therefore, the present embodiment is suitable for a case where the detection sensitivity has priority over the shielding effect on a disturbance magnetic field. In the present embodiment, the length L1 in the y direction of the first magnetic member 31 can be larger than the length L0 in the y direction of the sensor chip 20. In this case, the detection sensitivity can be enhanced more.

Figure 12:
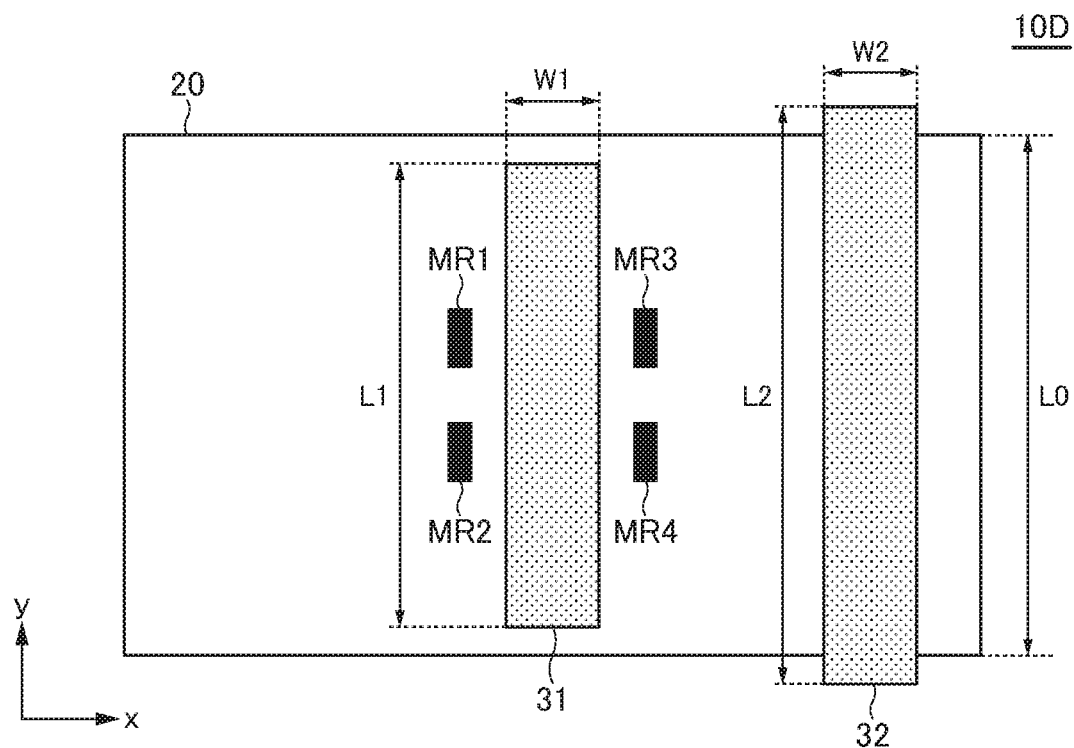
FIG. 12 is a schematic plan view illustrating a configuration of a magnetic sensor 10D according to a fourth embodiment of the present invention.
Figure 13:
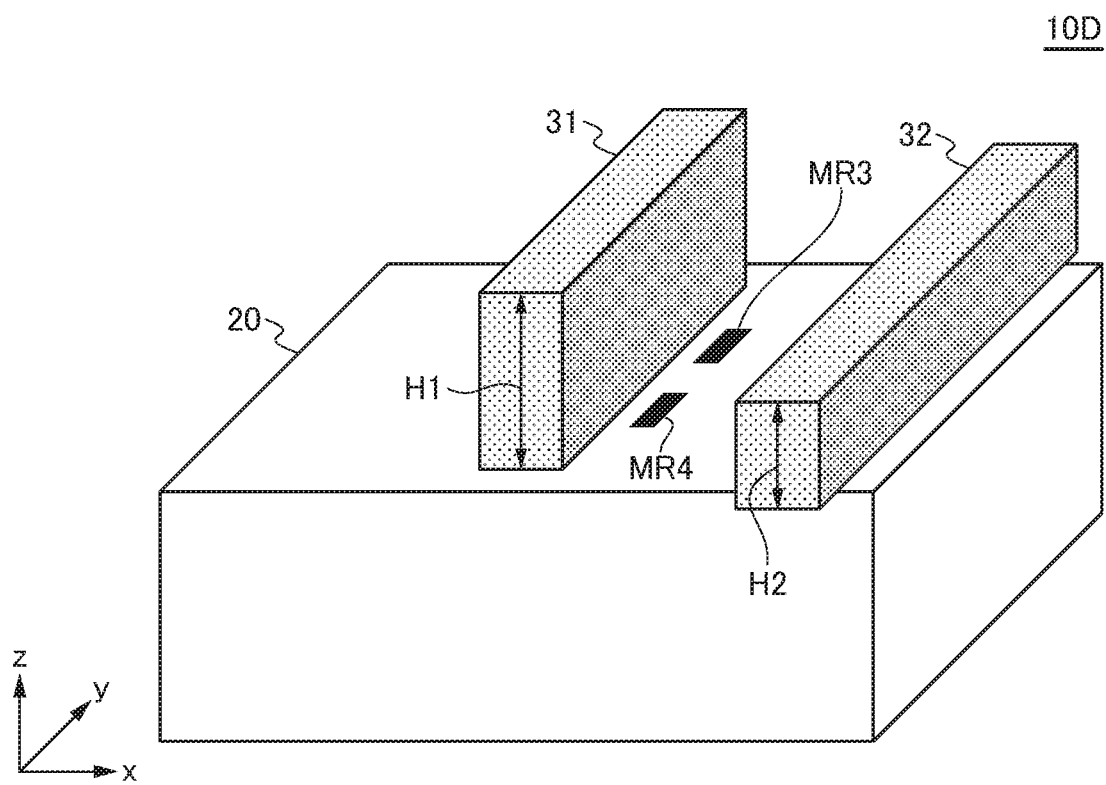
FIG. 13 is a schematic perspective view illustrating an external appearance of the magnetic sensor 10D.

FIG. 12 is a schematic plan view illustrating a configuration of a magnetic sensor 10D according to the fourth embodiment of the present invention, and FIG. 13 is a schematic perspective view illustrating an external appearance of the magnetic sensor 10D.

The magnetic sensor 10D according to the fourth embodiment is different from the magnetic sensor 10A according to the first embodiment illustrated in FIGS. 1 to 3 in that the length L2 in the y direction of the second magnetic member 32 is larger than the length L1 in the y direction of the first magnetic member 31. That is,

L1<L2.

Because other features of the magnetic sensor 10D are identical to those of the magnetic sensor 10A according to the first embodiment, the same elements are denoted by the same reference characters and redundant explanations thereof will be omitted.

With the magnetic sensor 10D according to the present embodiment, the shielding effect on a disturbance magnetic field due to the second magnetic member 32 can be enhanced more. Therefore, the present embodiment is suitable for a case where the shielding effect on a disturbance magnetic field has priority over the detection sensitivity. Depending on a required shielding performance, the length L2 in the y direction of the second magnetic member 32 can be smaller than the length L0 in the y direction of the sensor chip 20.

As exemplified in the second to fourth embodiments described above, the length L1 in the y direction of the first magnetic member 31 and the length L2 in the y direction of the second magnetic member 32 can be different from each other. Alternatively, one or both of the length L1 and the length L2 can be larger than the length L0 in the y direction of the sensor chip 20.

Figure 14:
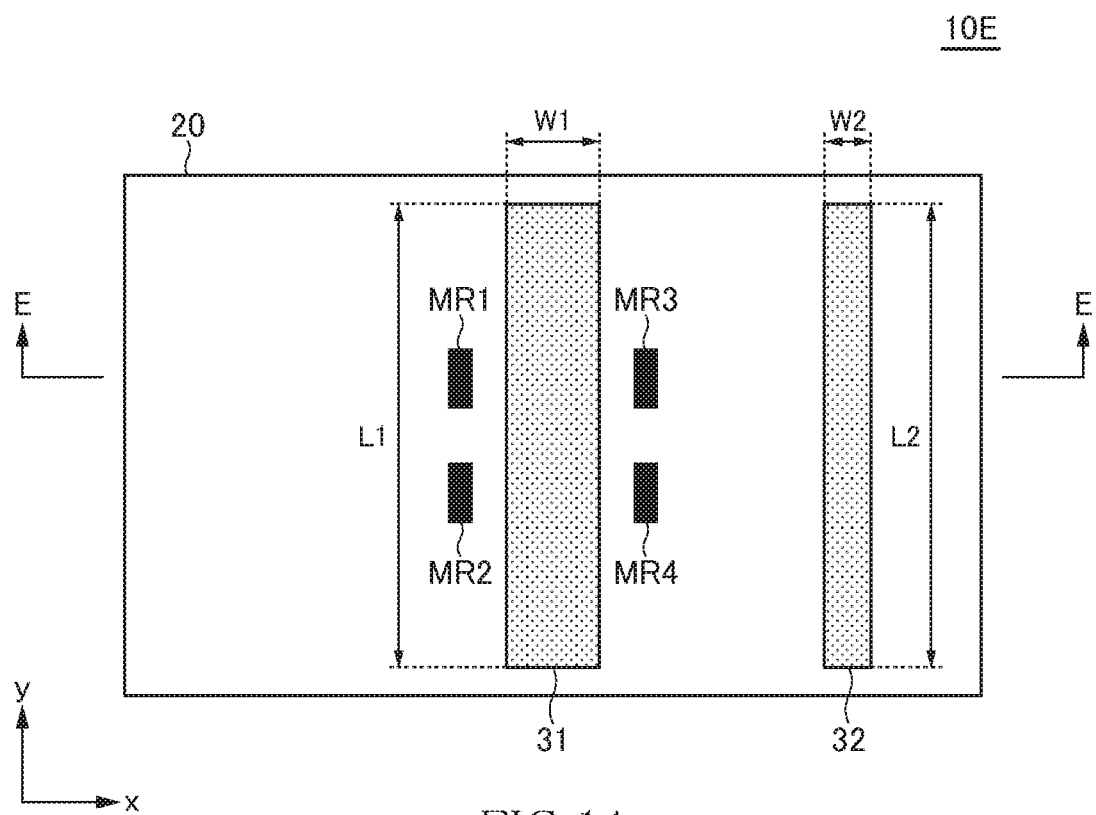
FIG. 14 is a schematic plan view illustrating a configuration of a magnetic sensor 10E according to a fifth embodiment of the present invention.
Figure 15:
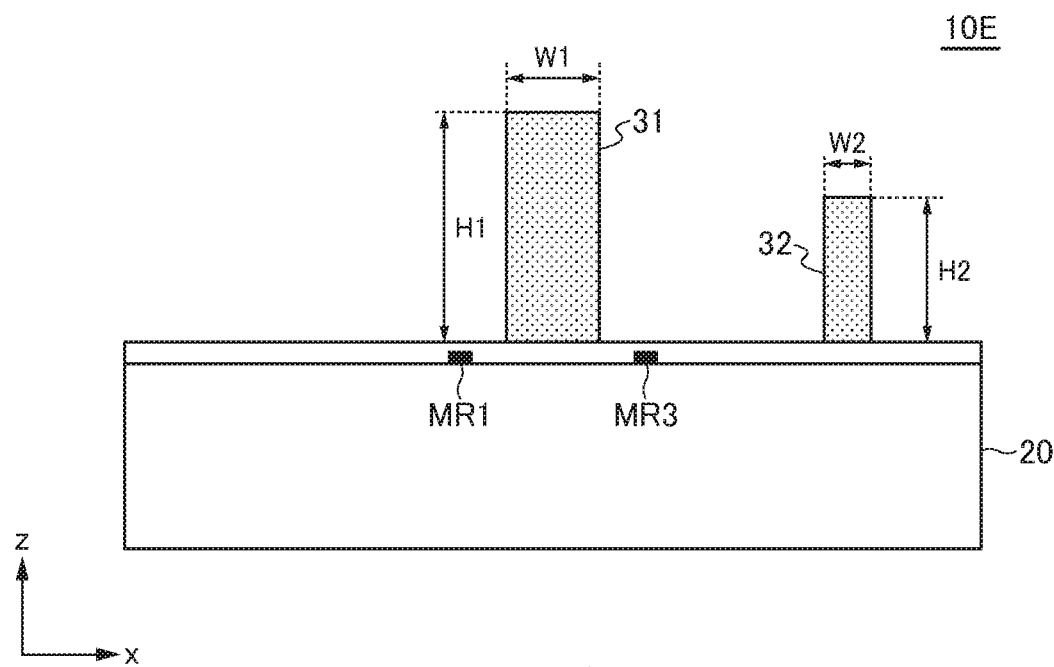
FIG. 15 is a schematic sectional view along a line E-E illustrated in FIG. 14.

FIG. 14 is a schematic plan view illustrating a configuration of a magnetic sensor 10E according to the fifth embodiment of the present invention, and FIG. 15 is a schematic sectional view along a line E-E illustrated in FIG. 14.

The magnetic sensor 10E according to the fifth embodiment is different from the magnetic sensor 10A according to the first embodiment illustrated in FIGS. 1 to 3 in that the width W2 in the x direction of the second magnetic member 32 is smaller than the width W1 in the x direction of the first magnetic member 31. That is,

W1>W2.

Because other features of the magnetic sensor 10E are identical to those of the magnetic sensor 10A according to the first embodiment, the same elements are denoted by the same reference characters and redundant explanations thereof will be omitted.

With the magnetic sensor 10E according to the present embodiment, less magnetic fluxes ø are attracted to the second magnetic member 32 and thus reduction of the detection sensitivity due to the second magnetic member 32 can be suppressed more. Therefore, the present embodiment is suitable for a case where the detection sensitivity has priority over the shielding effect on a disturbance magnetic field. In addition to narrowing the width W2 in the x direction of the second magnetic member 32, the length L2 in the y direction of the second magnetic member 32 can be formed to be smaller than the length L1 in the y direction of the first magnetic member 31. In this case, the detection sensitivity can be enhanced further.

Figure 16:
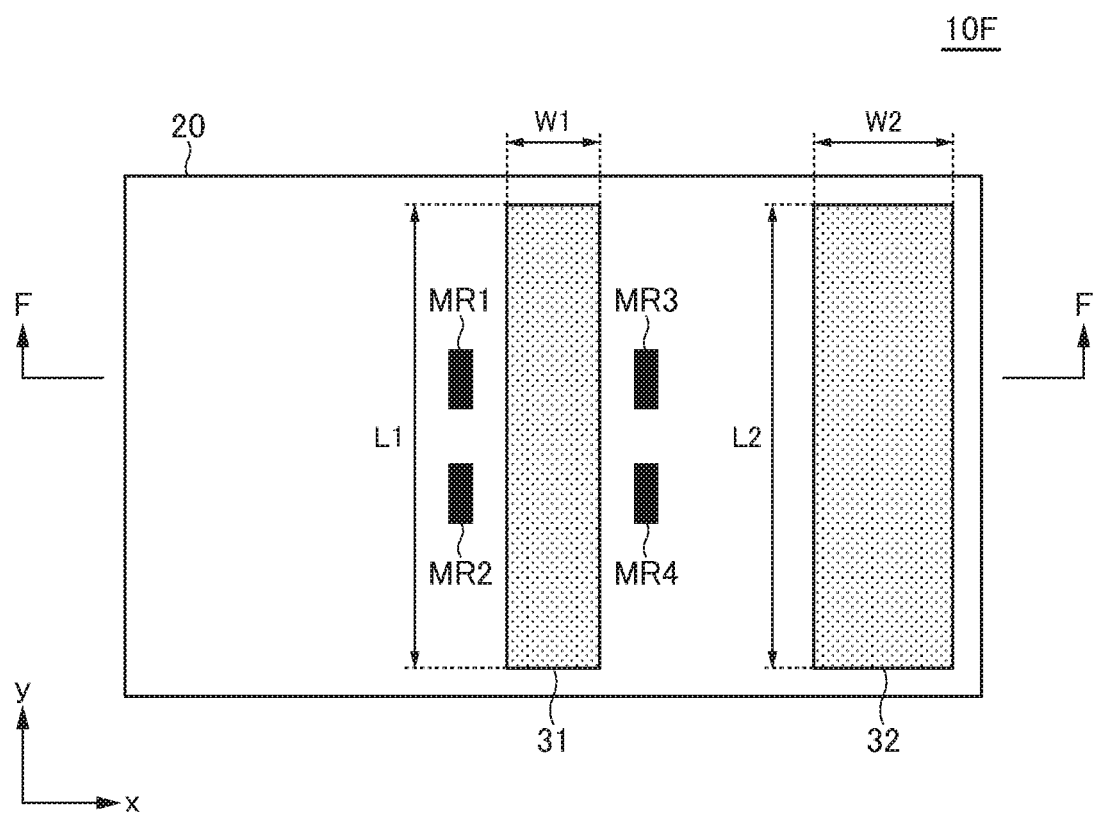
FIG. 16 is a schematic plan view illustrating a configuration of a magnetic sensor 10F according to a sixth embodiment of the present invention.
Figure 17:
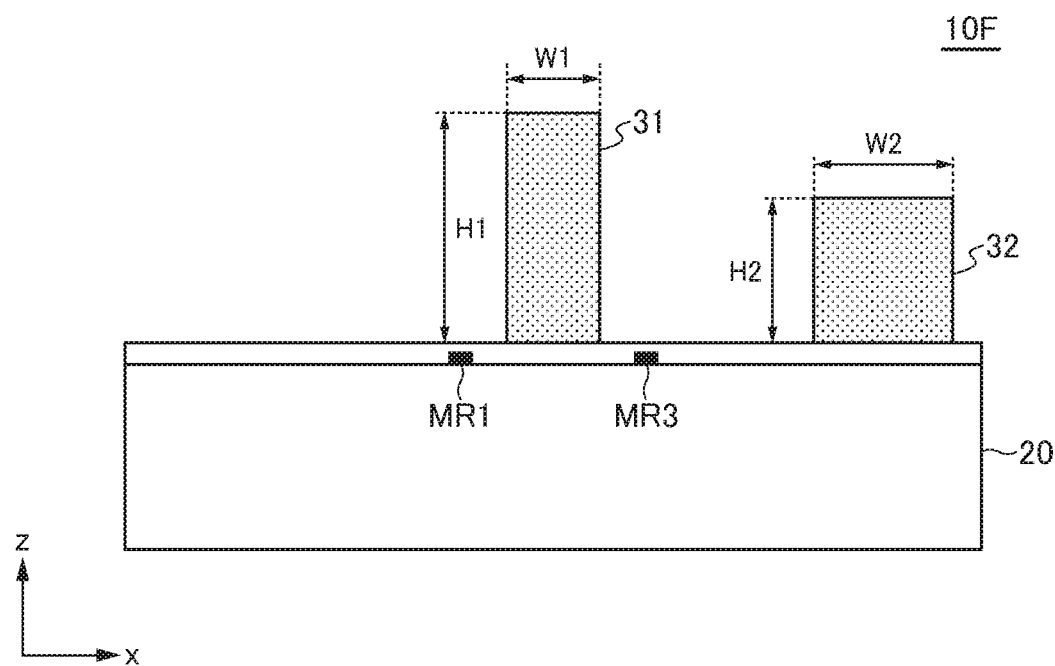
FIG. 17 is a schematic sectional view along a line F-F illustrated in FIG. 16.

FIG. 16 is a schematic plan view illustrating a configuration of a magnetic sensor 10F according to the sixth embodiment of the present invention, and FIG. 17 is a schematic sectional view along a line F-F illustrated in FIG. 16.

The magnetic sensor 10F according to the sixth embodiment is different from the magnetic sensor 10A according to the first embodiment illustrated in FIGS. 1 to 3 in that the width W2 in the x direction of the second magnetic member 32 is larger than the width W1 in the x direction of the first magnetic member 31. That is,

W1<W2.

Because other features of the magnetic sensor 10F are identical to those of the magnetic sensor 10A according to the first embodiment, the same elements are denoted by the same reference characters and redundant explanations thereof will be omitted.

With the magnetic sensor 10F according to the present embodiment, the shielding effect on a disturbance magnetic field due to the second magnetic member 32 is increased more. Therefore, the present embodiment is suitable for a case where the shielding effect on a disturbance magnetic field has priority over the detection sensitivity. In addition to increasing the width W2 in the x direction of the second magnetic member 32, the length L2 in the y direction of the second magnetic member 32 can be formed to be larger than the length L1 in the y direction of the first magnetic member 31. In this case, the shielding effect can be enhanced further.

Figure 18:
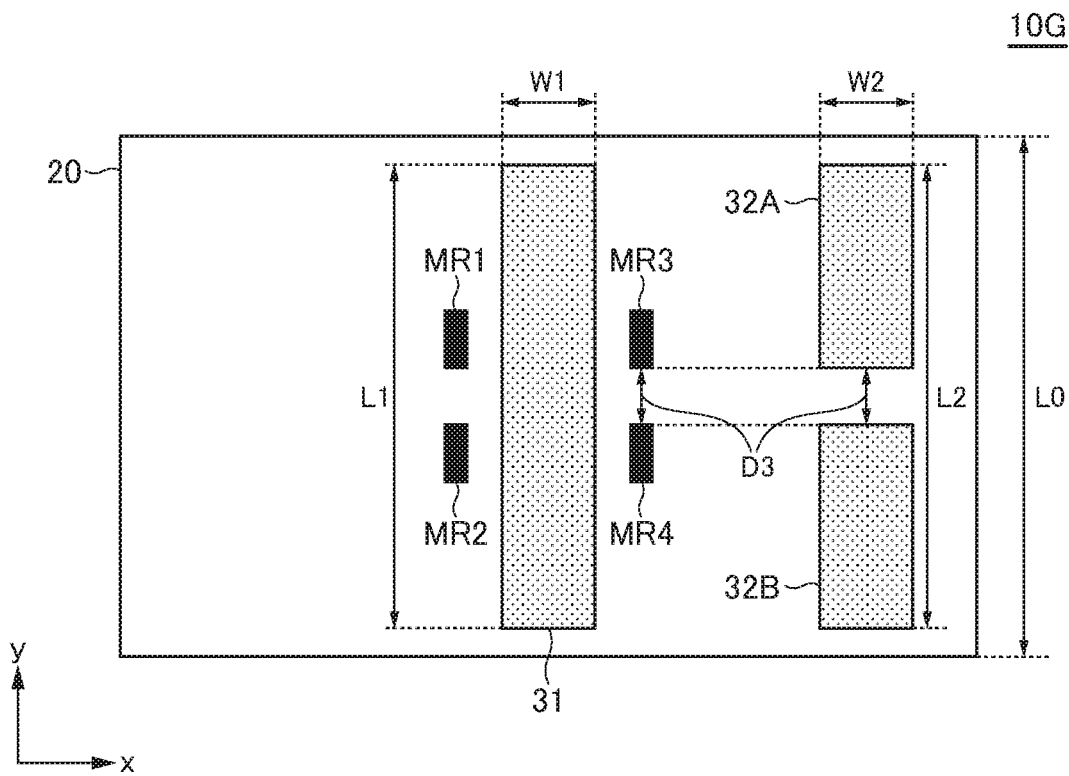
FIG. 18 is a schematic plan view illustrating a configuration of a magnetic sensor 10G according to a seventh embodiment of the present invention.
Figure 19:
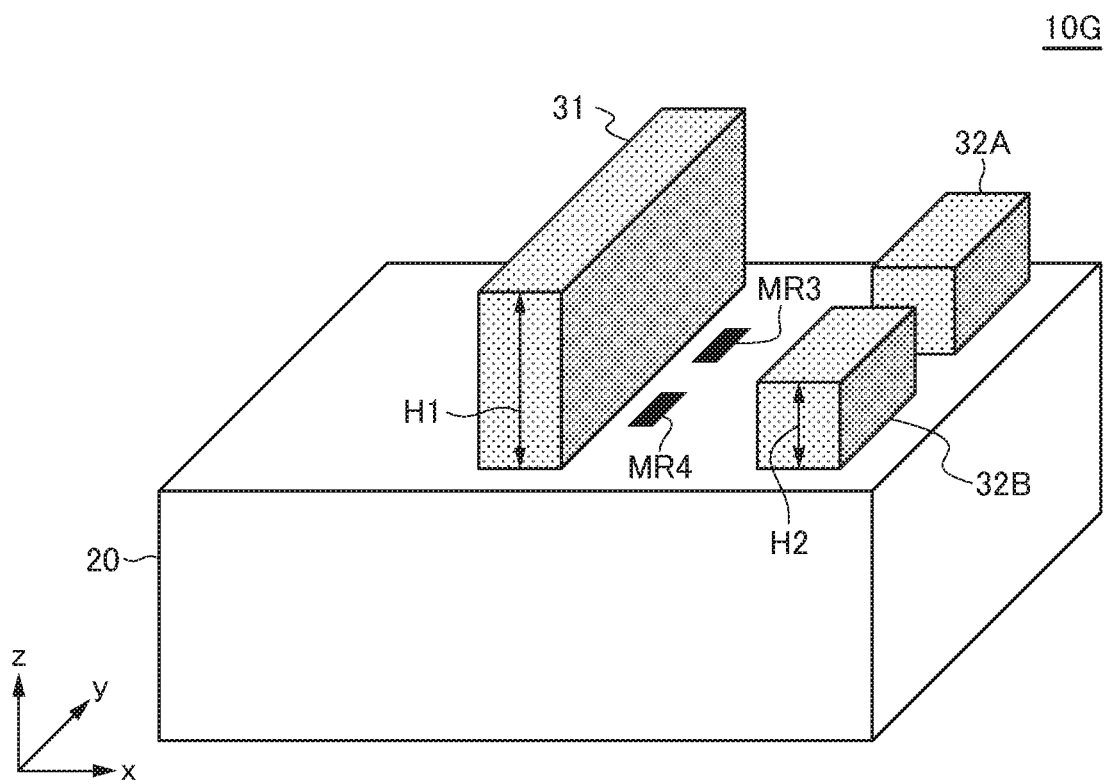
FIG. 19 is a schematic perspective view illustrating an external appearance of the magnetic sensor 10G.

FIG. 18 is a schematic plan view illustrating a configuration of a magnetic sensor 10G according to the seventh embodiment of the present invention, and FIG. 19 is a schematic perspective view illustrating an external appearance of the magnetic sensor 10G.

The magnetic sensor 10G according to the seventh embodiment is different from the magnetic sensor 10A according to the first embodiment illustrated in FIGS. 1 to 3 in that the second magnetic member 32 is divided in the y direction into two magnetic members 32A and 32B. Because other features of the magnetic sensor 10G are identical to those of the magnetic sensor 10A according to the first embodiment, the same elements are denoted by the same reference characters and redundant explanations thereof will be omitted.

While a division interval D3 between the magnetic members 32A and 32B is equal to an interval between the magnetic detection elements MR3 and MR4 in the present embodiment, this point is not essential. However, it is preferable that the y coordinate of an intermediate position in a gap between the magnetic member 32A and the magnetic member 32B and the y coordinate of an intermediate position in the magnetic detection elements MR3 and MR4 are aligned with each other. In this way, the magnetic member 32 does not always need to be one but can be divided into two or more portions.

Figure 20:
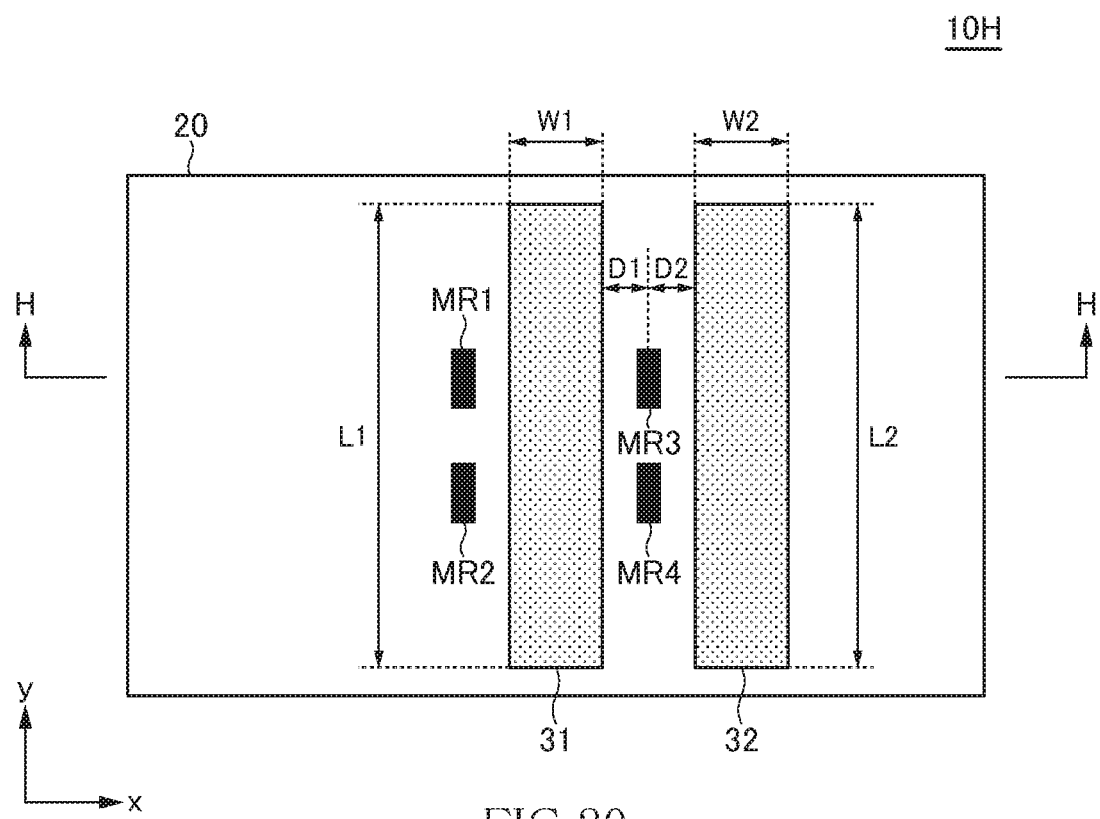
FIG. 20 is a schematic plan view illustrating a configuration of a magnetic sensor 10H according to an eighth embodiment of the present invention.
Figure 21:
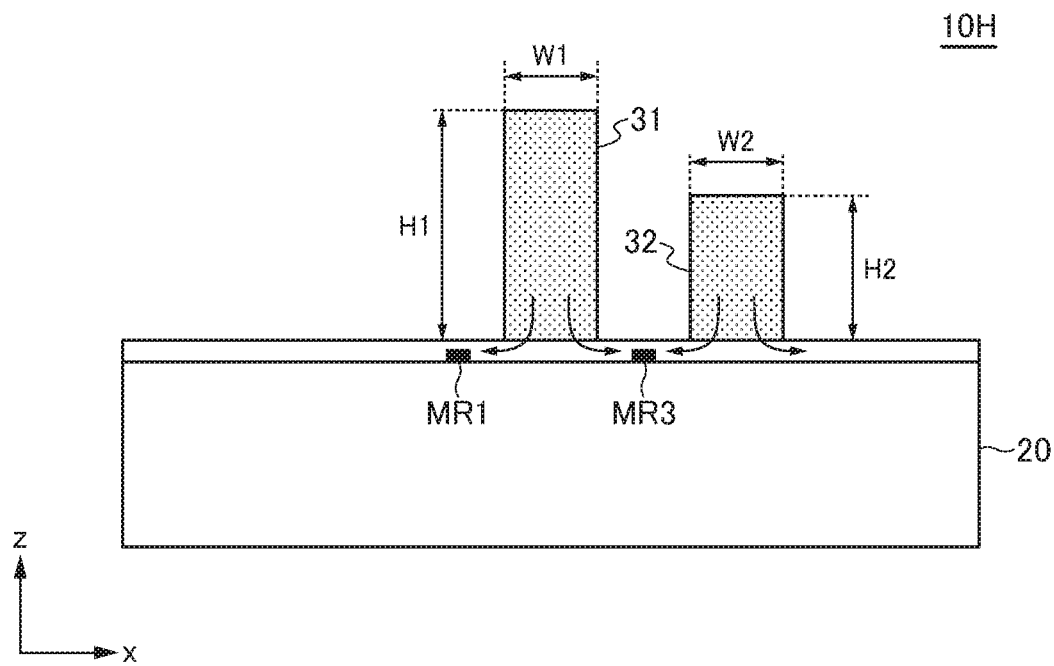
FIG. 21 is a schematic sectional view along a line H-H illustrated in FIG. 20.

FIG. 20 is a schematic plan view illustrating a configuration of a magnetic sensor 10H according to the eighth embodiment of the present invention, and FIG. 21 is a schematic sectional view along a line H-H illustrated in FIG. 20.

The magnetic sensor 10H according to the eighth embodiment is different from the magnetic sensor 10A according to the first embodiment illustrated in FIGS. 1 to 3 in that the distance D1 in the x direction between the magnetic detection elements MR3 and MR4 and the first magnetic member 31 and the distance D2 in the x direction between the magnetic detection elements MR3 and MR4 and the second magnetic member 32 are equal to each other. That is,

D1=D2.

Because other features of the magnetic sensor 10H are identical to those of the magnetic sensor 10A according to the first embodiment, the same elements are denoted by the same reference characters and redundant explanations thereof will be omitted.

Because the distance D2 is short in the present embodiment, the size in the x direction of the sensor chip can be reduced more. However, because the distance between the magnetic detection elements MR3 and MR4 and the second magnetic member 32 is short, the magnetic detection elements MR3 and M4 are intensely influenced by a uniform magnetic field such as terrestrial magnetism. Direct-current noise components such as terrestrial magnetism can be eliminated using a signal processing circuit.

Figure 22:
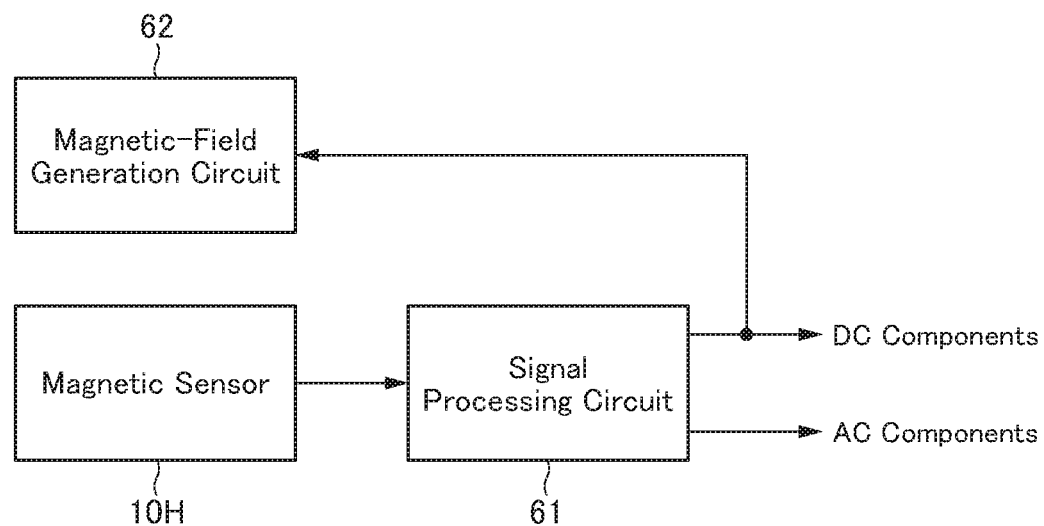
FIG. 22 is a block diagram of a magnetic-field detection device including a signal processing circuit 61 that eliminates direct-current noise components.

FIG. 22 is a block diagram of a magnetic-field detection device including a signal processing circuit 61 that eliminates direct-current noise components.

The signal processing circuit 61 illustrated in FIG. 22 functions to separate an output signal from the magnetic sensor 10H into DC components and AC components. Among these components, the DC components are components resulting from terrestrial magnetism. Therefore, when only the AC components are extracted, influences of terrestrial magnetism are eliminated and only a detection magnetic field can be accurately detected. Further, when the extracted DC components are fed back as a cancel signal to a magnetic-field generation circuit 62 and a cancel magnetic field is accordingly applied to the magnetic sensor 10H, terrestrial magnetism can be canceled out. This configuration prevents saturation of the magnetic sensor 10H due to terrestrial magnetism and thus highly-sensitive detection can be performed.

Figure 23:
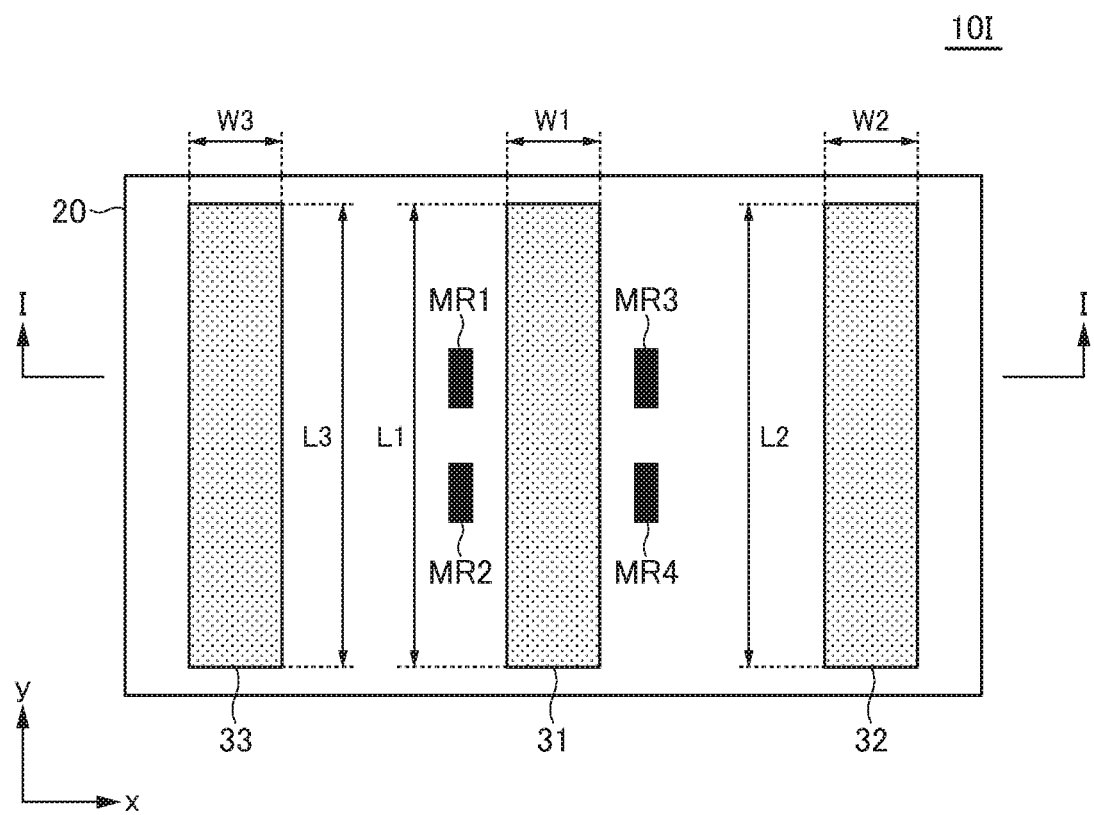
FIG. 23 is a schematic plan view illustrating a configuration of a magnetic sensor 10I according to a ninth embodiment of the present invention.
Figure 24:
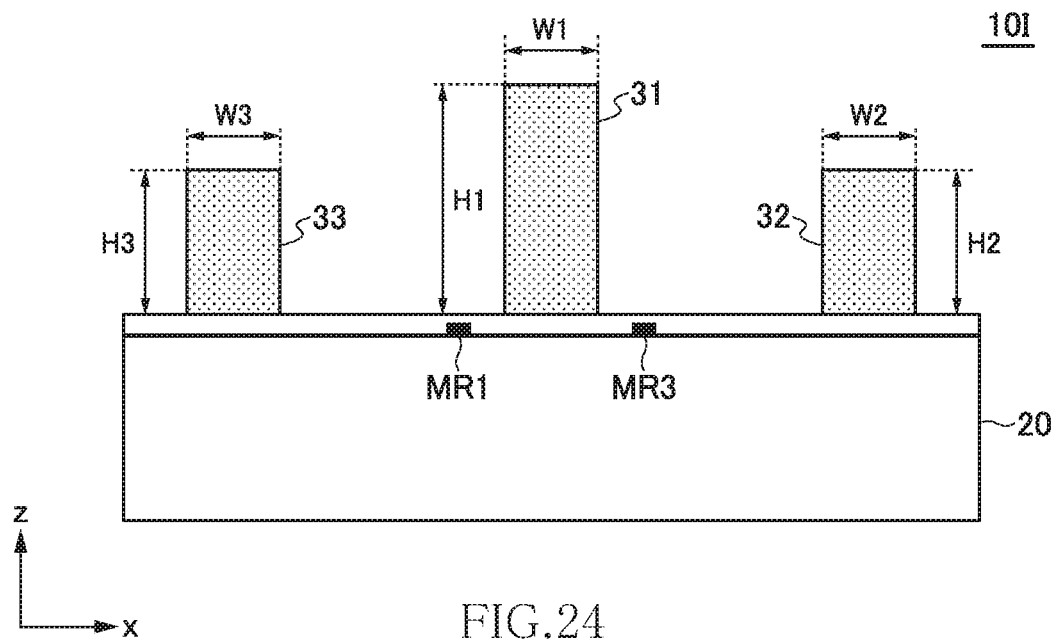
FIG. 24 is a schematic sectional view along a line I-I illustrated in FIG. 23.
Figure 25:
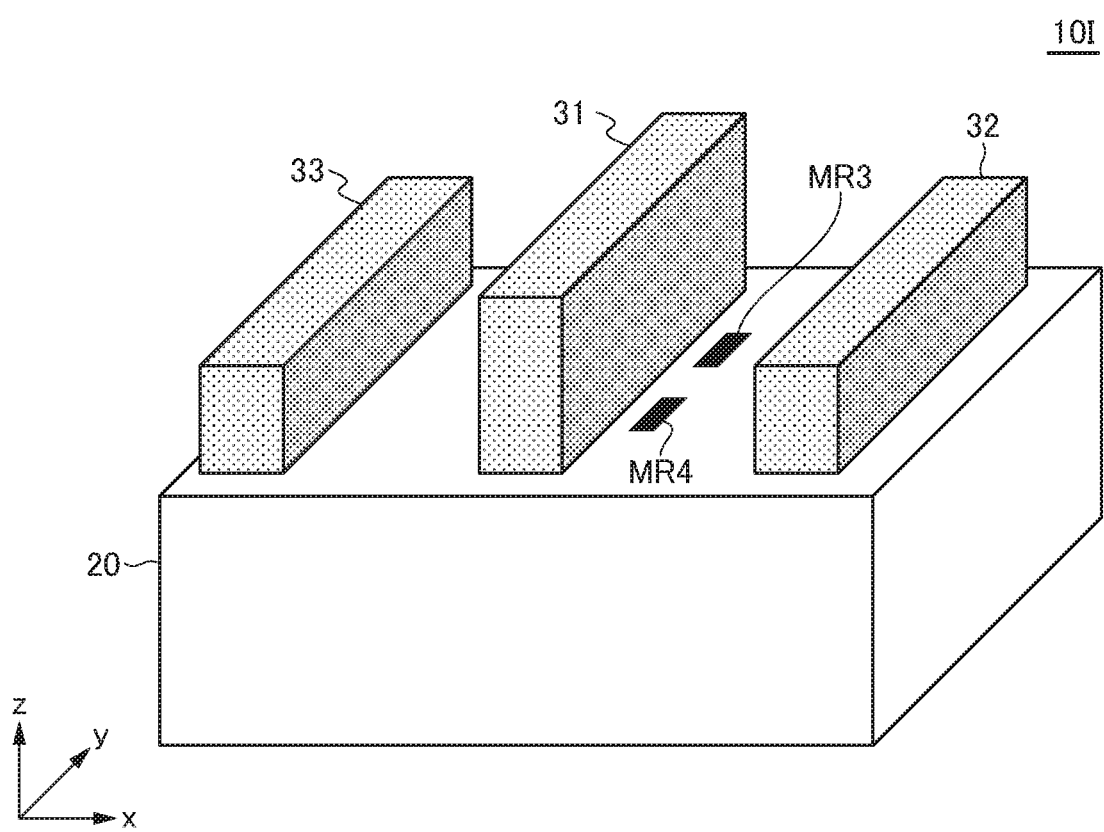
FIG. 25 is a schematic perspective view illustrating an external appearance of the magnetic sensor 10I.

FIG. 23 is a schematic plan view illustrating a configuration of a magnetic sensor 10I according to the ninth embodiment of the present invention, and FIG. 24 is a schematic sectional view along a line I-I illustrated in FIG. 23. FIG. 25 is a schematic perspective view illustrating an external appearance of the magnetic sensor 10I.

As illustrated in FIGS. 23 to 25, the magnetic sensor 10I according to the present embodiment is different from the magnetic sensor 10A according to the first embodiment illustrated in FIGS. 1 to 3 in including a third magnetic member 33. Because other features of the magnetic sensor 10I are identical to those of the magnetic sensor 10A according to the first embodiment, the same elements are denoted by the same reference characters and redundant explanations thereof will be omitted.

The third magnetic member 33 is provided on the opposite side of the magnetic detection elements MR1 and MR2 to the first magnetic member 31 and functions to shield a disturbance magnetic field similarly to the second magnetic field 32. When it is assumed that the third magnetic member 33 has a width W3 in the x direction, a length L3 in the y direction, and a height H3 in the z direction, W1=W2=W3,
L1=L2=L3, and
H1>H2=H3 in the present embodiment. That is, the third magnetic member 33 has the same size as that of the second magnetic member 32.

Figure 26:
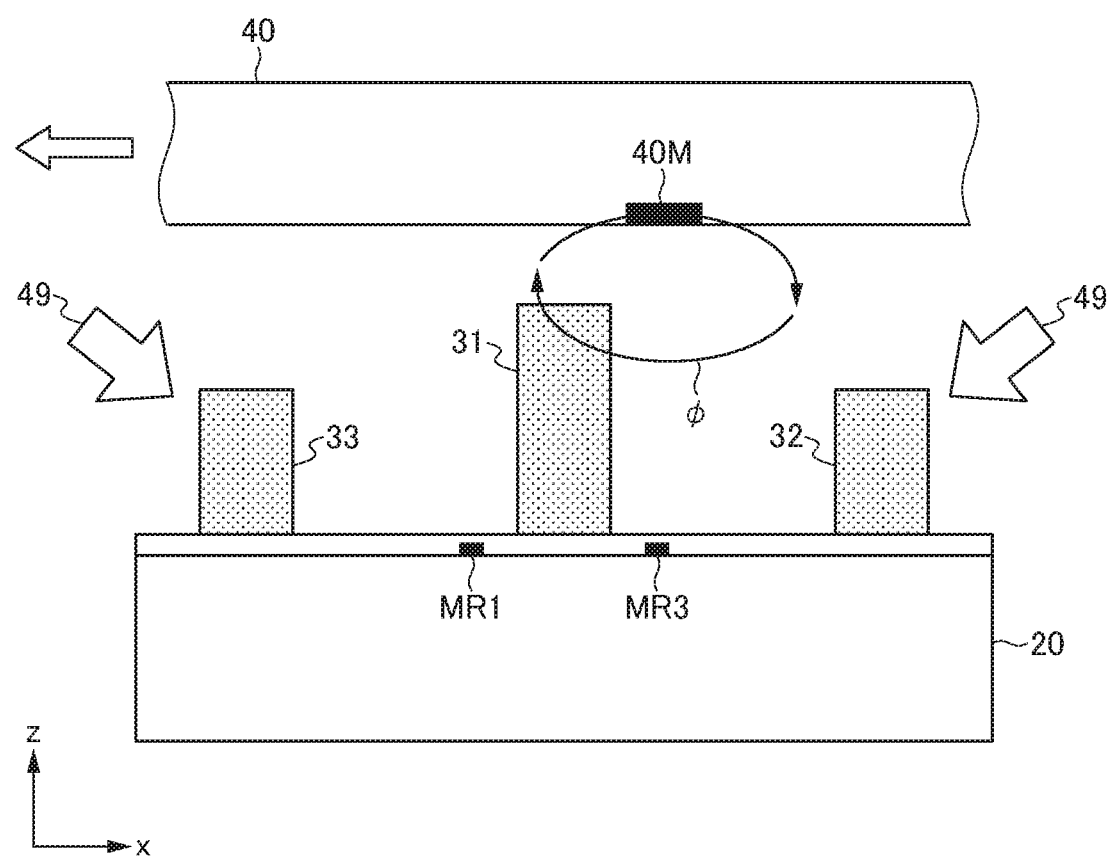
FIG. 26 is a schematic diagram for explaining a state where a disturbance magnetic field 49 is shielded.

With this configuration, when the soft magnetic member 40M included in the magnetic medium 40 is to be detected, at least a part of the disturbance magnetic field 49 from both sides in the x direction is shielded by the second and third magnetic members 32 and 33 as illustrated in FIG. 26. Therefore, the disturbance magnetic field 49 entering the magnetic detection elements MR1 to MR4 can be further reduced.

Figure 27:
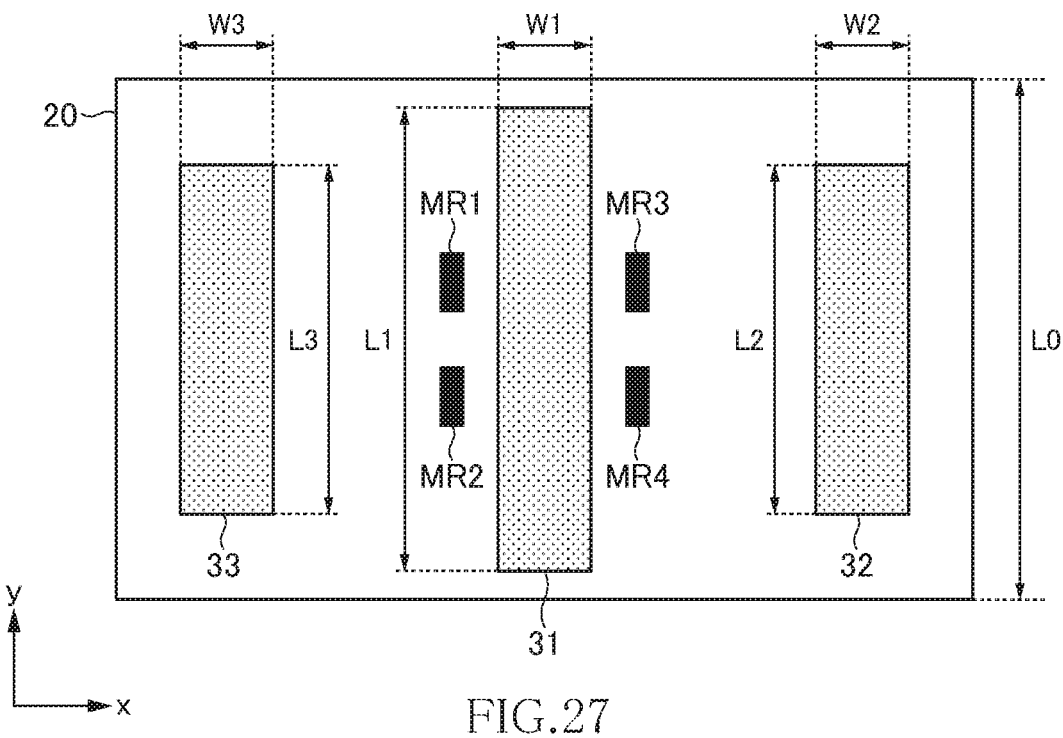
FIG. 27 is a schematic plan view illustrating a configuration of a magnetic sensor 10J according to a tenth embodiment of the present invention.
Figure 28:
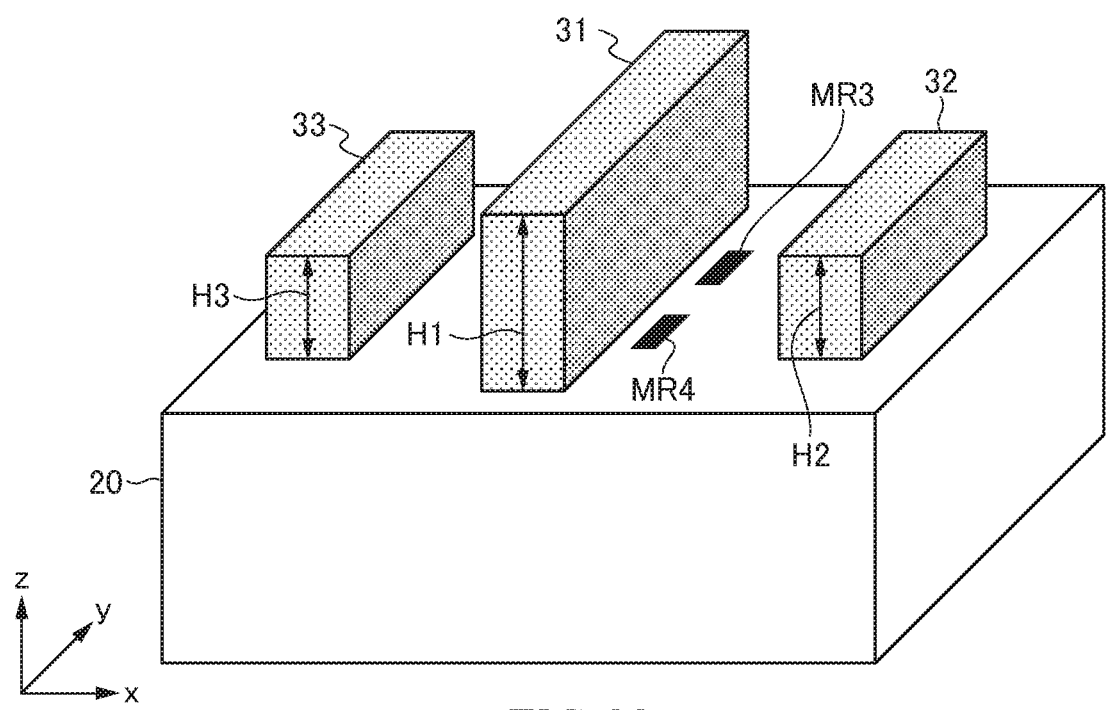
FIG. 28 is a schematic perspective view illustrating an external appearance of the magnetic sensor 10J.

FIG. 27 is a schematic plan view illustrating a configuration of a magnetic sensor 10J according to the tenth embodiment of the present invention, and FIG. 28 is a schematic perspective view illustrating an external appearance of the magnetic sensor 10J.

The magnetic sensor 10J according to the tenth embodiment is different from the magnetic sensor 10I according to the ninth embodiment illustrated in FIGS. 23 to 25 in that the lengths L2 and L3 in the y direction of the second and third magnetic members 32 and 33 are smaller than the length L1 in the y direction of the first magnetic member 31. That is, L1>L2, and
L1>L3.

Because other features of the magnetic sensor 10J are identical to those of the magnetic sensor 10I according to the ninth embodiment, the same elements are denoted by the same reference characters and redundant explanations thereof will be omitted.

With the magnetic sensor 10J according to the present invention, less magnetic fluxes ø are attracted to the second and third magnetic members 32 and 33 and therefore reduction of the detection sensitivity due to the second and third magnetic members 32 and 33 can be suppressed more. Accordingly, the present embodiment is suitable for a case where the detection sensitivity has priority over the shielding effect on a disturbance magnetic field. In the present embodiment, the length L2 in the y direction of the second magnetic member 32 and the length L3 in the y direction of the third magnetic member 33 can be different from each other. Further, the length L1 in the y direction of the first magnetic member 31 can be larger than the length L0 in the y direction of the sensor chip 20.

Figure 29:
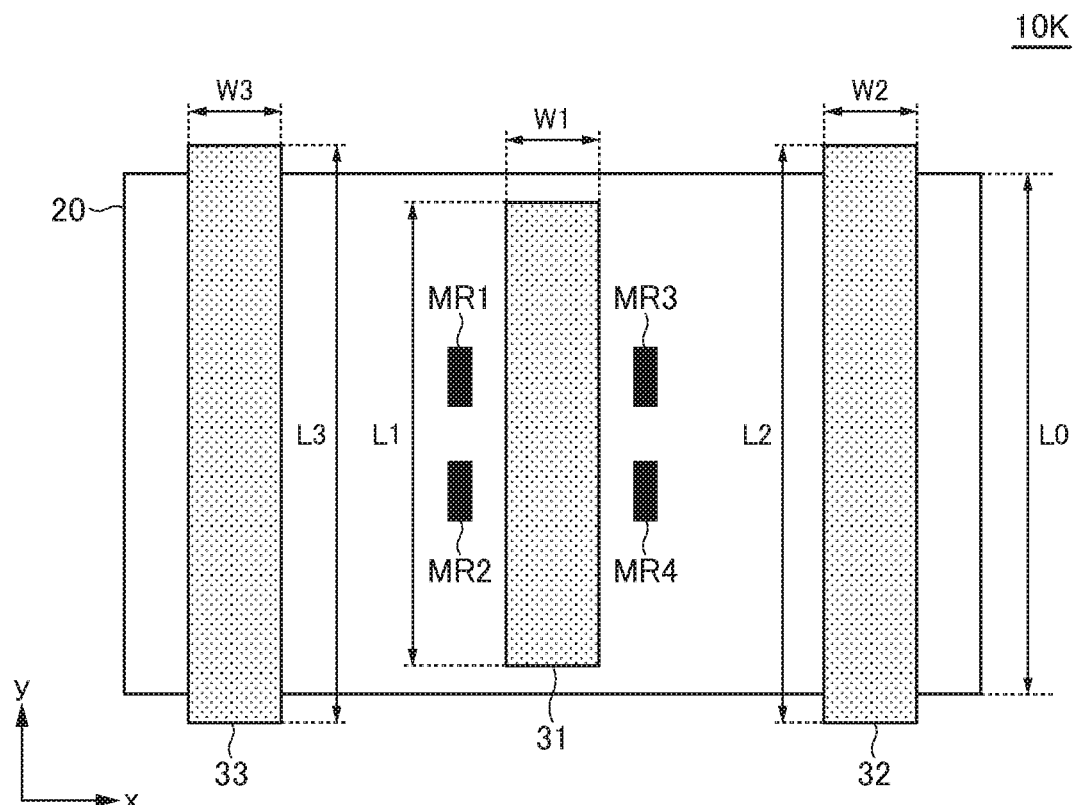
FIG. 29 is a schematic plan view illustrating a configuration of a magnetic sensor 10K according to an eleventh embodiment of the present invention.
Figure 30:
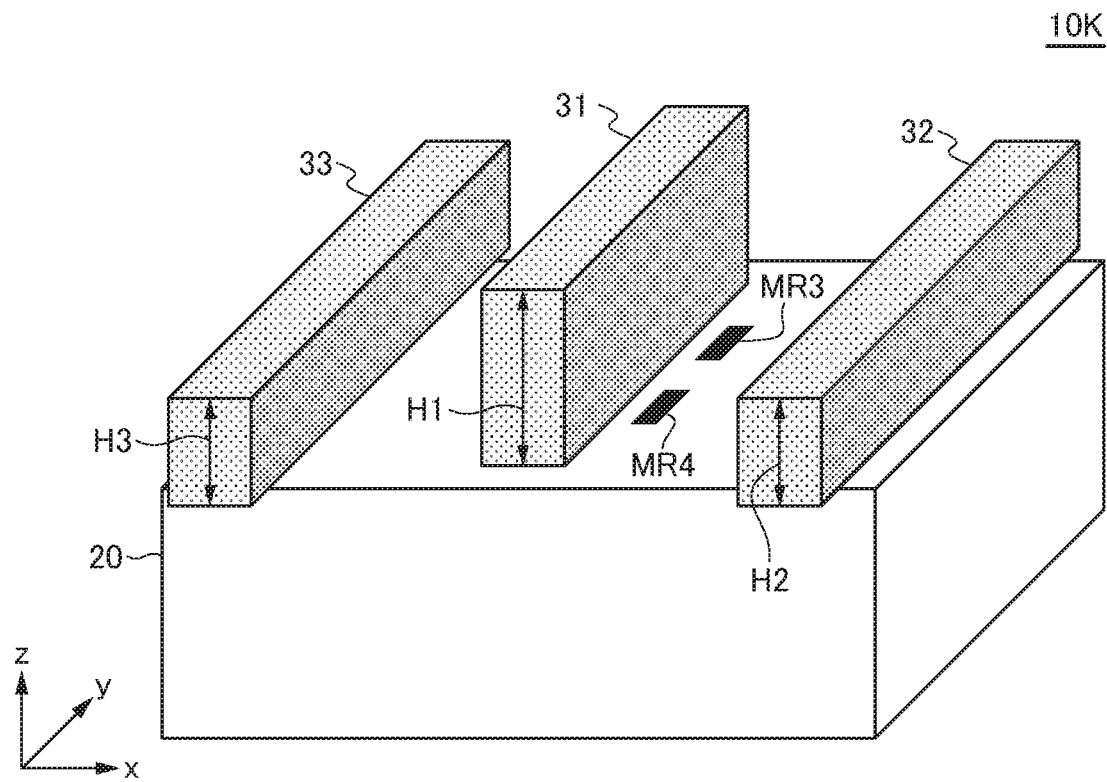
FIG. 30 is a schematic perspective view illustrating an external appearance of the magnetic sensor 10K.

FIG. 29 is a schematic plan view illustrating a configuration of a magnetic sensor 10K according to the eleventh embodiment of the present invention, and FIG. 30 is a schematic perspective view illustrating an external appearance of the magnetic sensor 10K.

The magnetic sensor 10K according to the eleventh embodiment is different from the magnetic sensor 10I according to the ninth embodiment illustrated in FIGS. 23 to 25 in that the lengths L2 and L3 in the y direction of the second and third magnetic members 32 and 33 are larger than the length L1 in the y direction of the first magnetic member 31. That is, L1<L2, and
L1<L3.

Because other features of the magnetic sensor 10K are identical to those of the magnetic sensor 10I according to the ninth embodiment, the same elements are denoted by the same reference characters and redundant explanations thereof will be omitted.

With the magnetic sensor 10K according to the present embodiment, the shielding effect on a disturbance magnetic field due to the second and third magnetic members 32 and 33 is enhanced more. Therefore, the present embodiment is suitable for a case where the shielding effect on a disturbance magnetic field has priority over the detection sensitivity. In the present embodiment, the length L2 in the y direction of the second magnetic member 32 and the length L3 in the y direction of the third magnetic member 33 can be different from each other. Further, the lengths L2 and L3 in the y direction of the second and third magnetic members 32 and 33 can be smaller than the length L0 in the y direction of the sensor chip 20.

Figure 31:
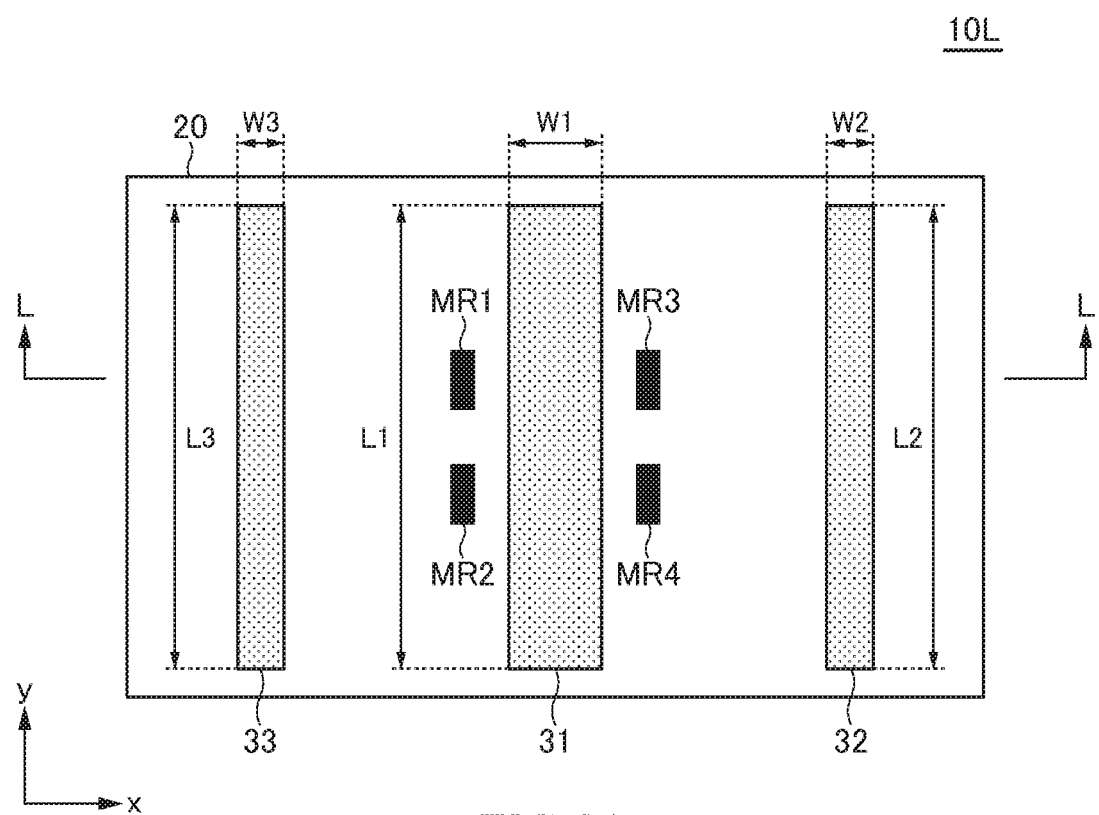
FIG. 31 is a schematic plan view illustrating a configuration of a magnetic sensor 10L according to a twelfth embodiment of the present invention.
Figure 32:
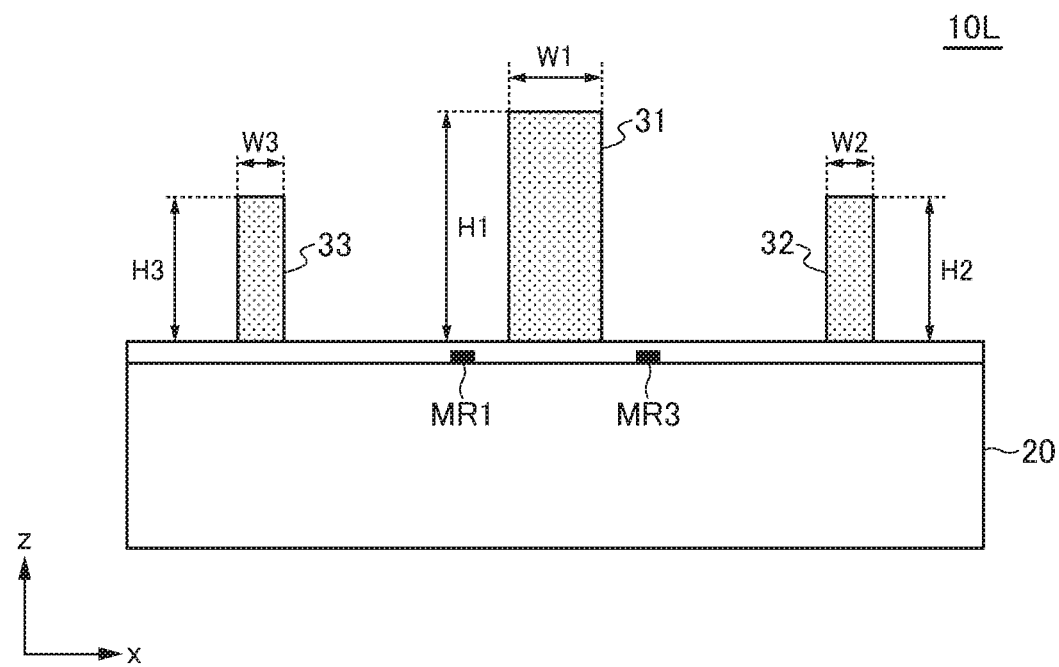
FIG. 32 is a schematic sectional view along a line L-L illustrated in FIG. 31.

FIG. 31 is a schematic plan view illustrating a configuration of a magnetic sensor 10L according to the twelfth embodiment of the present invention, and FIG. 32 is a schematic sectional view along a line L-L illustrated in FIG. 31.

The magnetic sensor 10L according to the twelfth embodiment is different from the magnetic sensor 10I according to the ninth embodiment illustrated in FIGS. 23 to 25 in that the widths W2 and W3 in the x direction of the second and third magnetic members 32 and 33 are smaller than the width W1 in the x direction of the first magnetic member 31. That is, W1>W2, and
W1>W3.

Because other features of the magnetic sensor 10L are identical to those of the magnetic sensor 10I according to the ninth embodiment, the same elements are denoted by the same reference characters and redundant explanations thereof will be omitted.

With the magnetic sensor 10L according to the present embodiment, less magnetic fluxes ø are attracted to the second and third magnetic members 32 and 33 and thus reduction of the detection sensitivity due to the second and third magnetic members 32 and 33 can be suppressed more. Therefore, the present embodiment is suitable for a case where the detection sensitivity has priority over the shielding effect on a disturbance magnetic field. In the present embodiment, the width W2 in the x direction of the second magnetic member 32 and the width W3 in the x direction of the third magnetic member 33 can be different from each other. Further, in addition to narrowing the widths W2 and W3 in the x direction of the second and third magnetic members 32 and 33, the lengths L2 and L3 in the y direction of the second and third magnetic members 32 and 33 can be formed to be smaller than the length L1 in the y direction of the first magnetic member 31. In this case, the detection sensitivity can be enhanced further.

Figure 33:
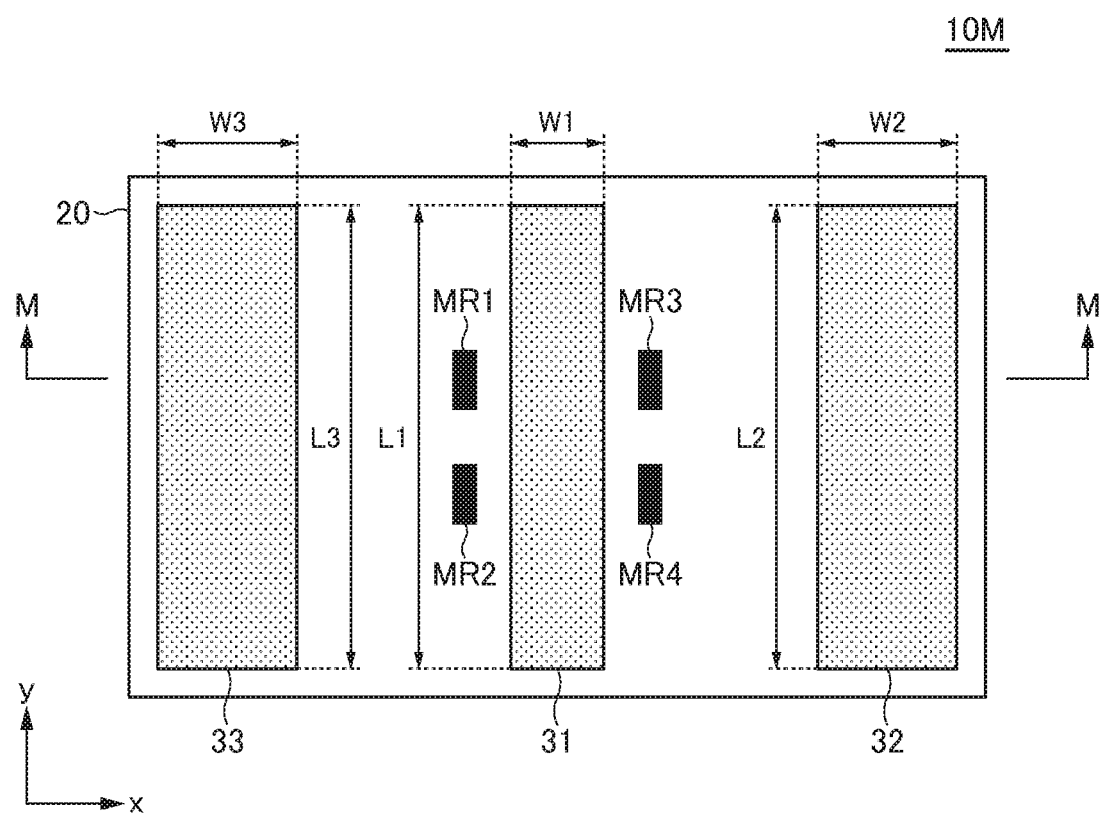
FIG. 33 is a schematic plan view illustrating a configuration of a magnetic sensor 10M according to a thirteenth embodiment of the present invention.
Figure 34:
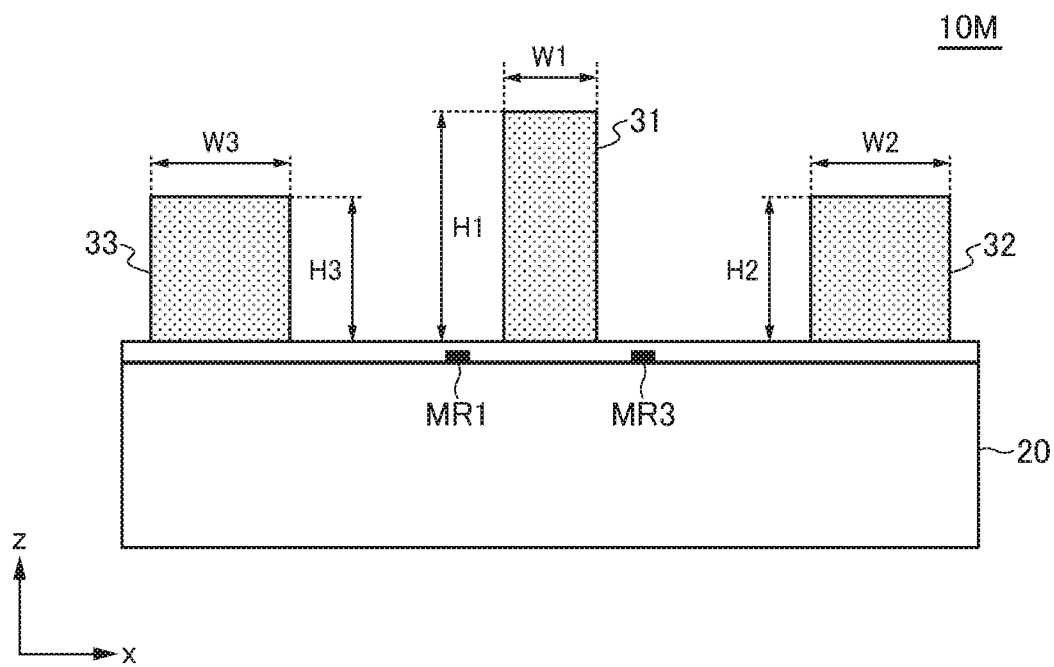
FIG. 34 is a schematic sectional view along a line M-M illustrated in FIG. 33.

FIG. 33 is a schematic plan view illustrating a configuration of a magnetic sensor 10M according to the thirteenth embodiment of the present invention, and FIG. 34 is a schematic sectional view along a line M-M illustrated in FIG. 33.

The magnetic sensor 10M according to the thirteenth embodiment is different from the magnetic sensor 10I according to the ninth embodiment illustrated in FIGS. 23 to 25 in that the widths W2 and W3 in the x direction of the second and third magnetic members 32 and 33 are larger than the width W1 in the x direction of the first magnetic member 31. That is, W1<W2, and
W1<W3.

Because other features of the magnetic sensor 10M are identical to those of the magnetic sensor 10I according to the ninth embodiment, the same elements are denoted by the same reference characters and redundant explanations thereof will be omitted.

With the magnetic sensor 10M according to the present embodiment, the shielding effect on a disturbance magnetic field due to the second and third magnetic members 32 and 33 is increased more. Therefore, the present embodiment is suitable for a case where the shielding effect on a disturbance magnetic field has priority over the detection sensitivity. In the present embodiment, the width W2 in the x direction of the second magnetic member 32 and the width W3 in the x direction of the third magnetic member 33 can be different from each other. Further, in addition to increasing the widths W2 and W3 in the x direction of the second and third magnetic members 32 and 33, the lengths L2 and L3 in the y direction of the second and third magnetic members 32 and 33 can be formed to be larger than the length L1 in the y direction of the first magnetic member 31. In this case, the shielding effect can be enhanced further.

Figure 35:
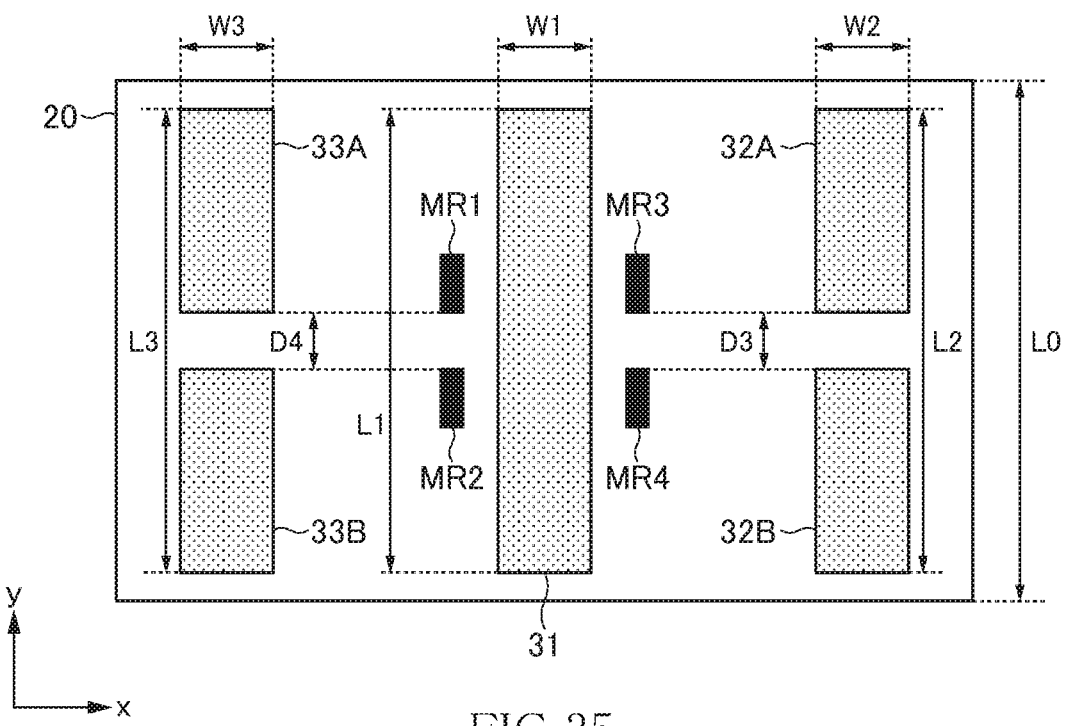
FIG. 35 is a schematic plan view illustrating a configuration of a magnetic sensor 10N according to a fourteenth embodiment of the present invention.
Figure 36:
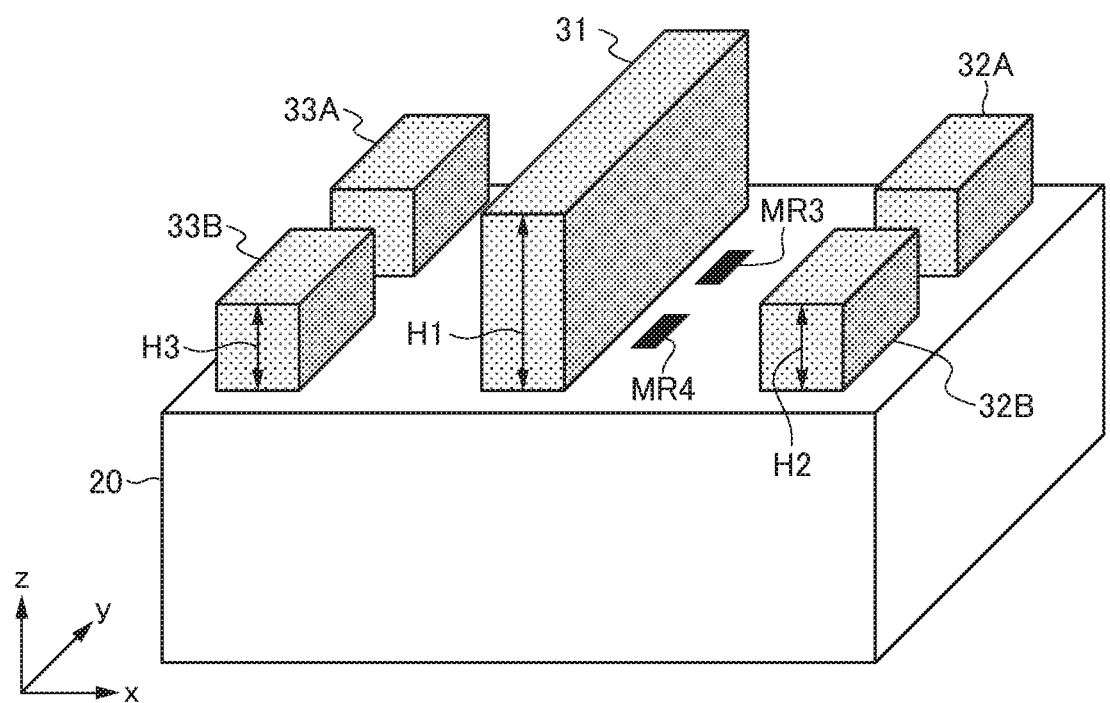
FIG. 36 is a schematic perspective view illustrating an external appearance of the magnetic sensor 10N.

FIG. 35 is a schematic plan view illustrating a configuration of a magnetic sensor 10N according to the fourteenth embodiment of the present invention, and FIG. 36 is a schematic perspective view illustrating an external appearance of the magnetic sensor 10N.

The magnetic sensor 10N according to the fourteenth embodiment is different from the magnetic sensor 10I according to the ninth embodiment illustrated in FIGS. 23 to 25 in that the second magnetic member 32 is divided in the y direction into the two magnetic members 32A and 32B and the third magnetic member 33 is divided in the y direction into two magnetic members 33A and 33B. Because other features of the magnetic sensor 10N are identical to those of the magnetic sensor 10I according to the ninth embodiment, the same elements are denoted by the same reference characters and redundant explanations thereof will be omitted.

In the present embodiment, the division interval D3 between the magnetic members 32A and 32B is equal to the interval between the magnetic detection elements MR3 and MR4, and a division interval D4 between the magnetic members 33A and 33B is equal to an interval between the magnetic detection elements MR1 and MR2 although this point is not essential. However, it is preferable that the y coordinate of the intermediate position in the gap between the magnetic member 32A and the magnetic member 32B, the y coordinate of an intermediate position in a gap between the magnetic member 33A and the magnetic member 33B, the y coordinate of the intermediate position in the magnetic detection elements MR3 and MR4, and the y coordinate of an intermediate position in the magnetic detection elements MR1 and MR2 are all aligned. In this way, the third magnetic member 33 does not always need to be one but can be divided into two or more portions. Only one of the second and third magnetic members 32 and 33 can be divided into two or more portions.

Figure 37:
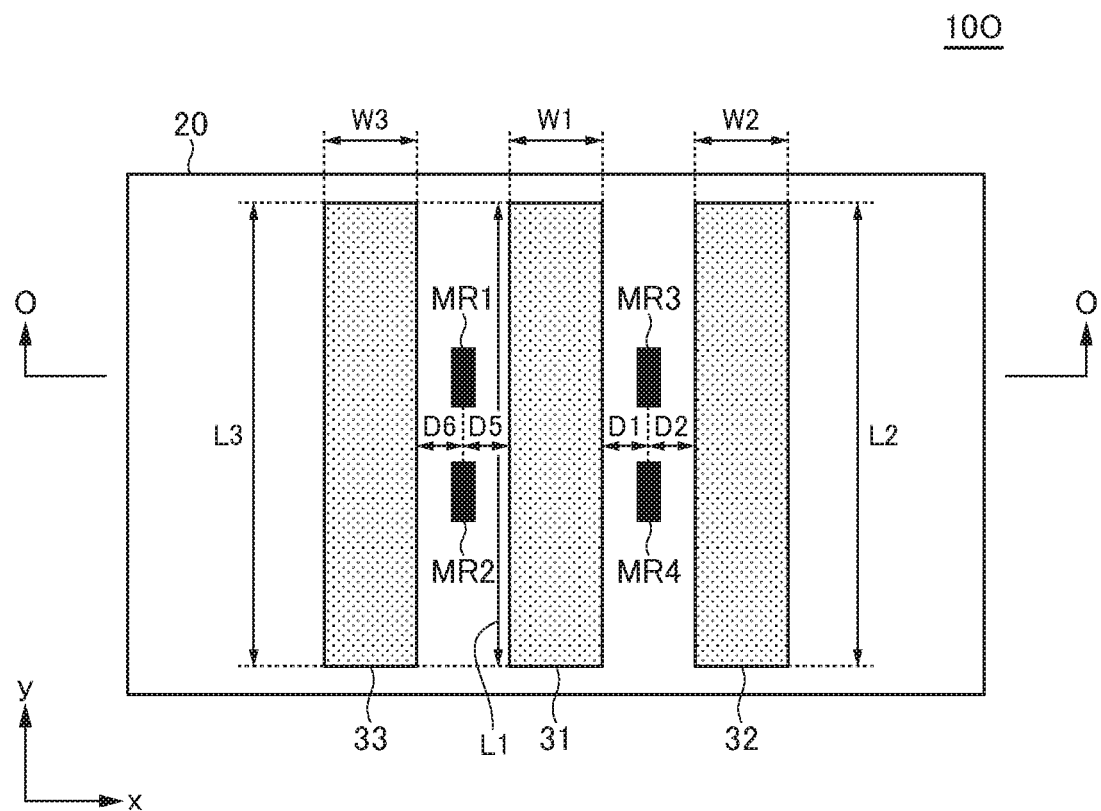
FIG. 37 is a schematic plan view illustrating a configuration of a magnetic sensor 10O according to a fifteenth embodiment of the present invention.
Figure 38:
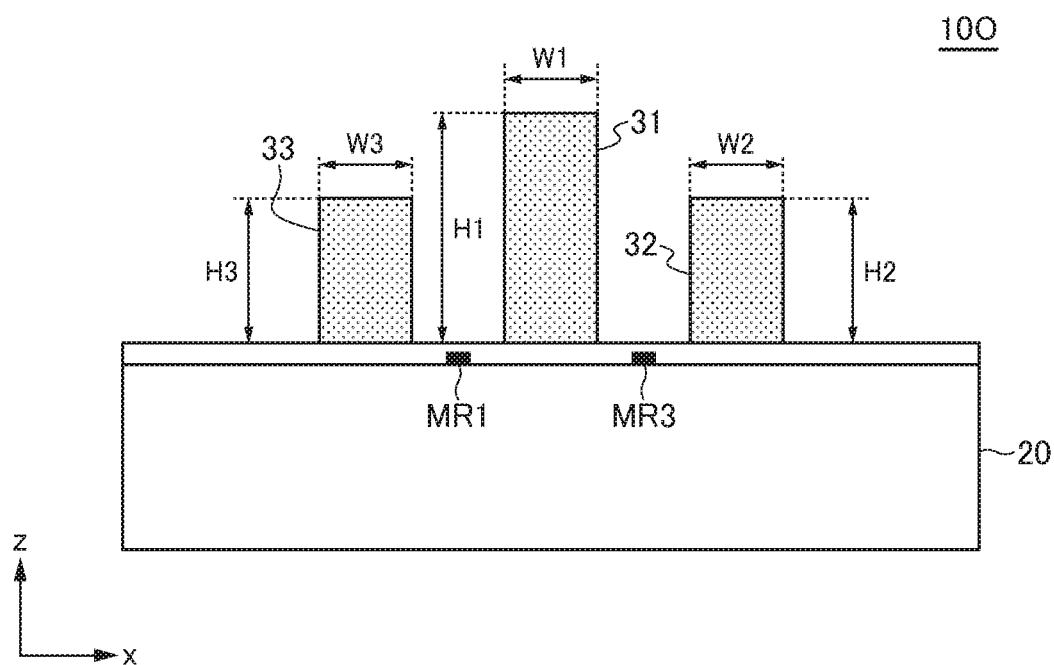
FIG. 38 is a schematic sectional view along a line O-O illustrated in FIG. 37.

FIG. 37 is a schematic plan view illustrating a configuration of a magnetic sensor 10O according to the fifteenth embodiment of the present invention, and FIG. 38 is a schematic sectional view along a line O-O illustrated in FIG. 37.

The magnetic sensor 10O according to the fifteenth embodiment is different from the magnetic sensor 10I according to the ninth embodiment illustrated in FIGS. 23 to 25 in that the distance D1 in the x direction between the magnetic detection elements MR3 and MR4 and the first magnetic member 31 and the distance D2 in the x direction between the magnetic detection elements MR3 and MR4 and the second magnetic member 32 are equal to each other, and that a distance D5 in the x direction between the magnetic detection elements MR1 and MR2 and the first magnetic member 31 and a distance D6 in the x direction between the magnetic detection elements MR1 and MR2 and the third magnetic member 33 are equal to each other. That is, D1=D2, and
D5=D6.

Preferably,

D1=D2=D5=D6.

Because other features of the magnetic sensor 10O are identical to those of the magnetic sensor 10I according to the ninth embodiment, the same elements are denoted by the same reference characters and redundant explanations thereof will be omitted.

Because the distances D2 and D6 are short in the present embodiment, the size in the x direction of the sensor chip 20 can be reduced more. In this case, the magnetic detection elements MR1 to MR4 are intensely influenced by a uniform magnetic field such as terrestrial magnetism. However, such a magnetic field can be eliminated using the signal processing circuit as explained with reference to FIG. 22.

Figure 39:
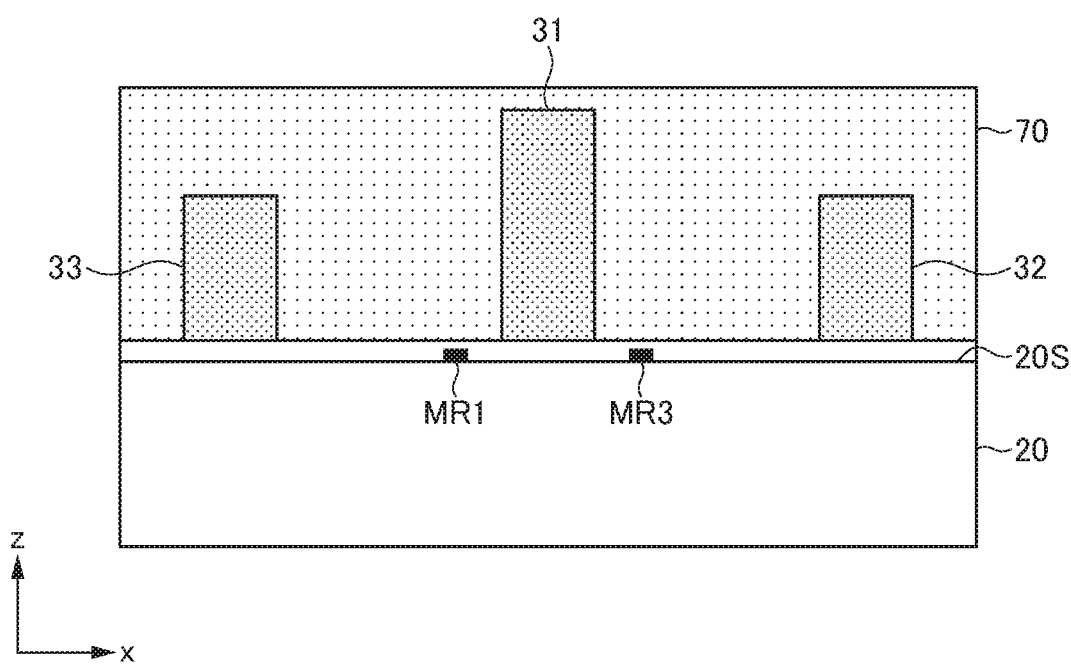
FIG. 39 is a schematic sectional view illustrating a configuration of a magnetic sensor 10P according to a sixteenth embodiment of the present invention.

FIG. 39 is a schematic sectional view illustrating a configuration of a magnetic sensor 10P according to the sixteenth embodiment of the present invention.

The magnetic sensor 10P according to the sixteenth embodiment is different from the magnetic sensor 10I according to the ninth embodiment illustrated in FIGS. 23 to 25 in including a protection member 70 that covers the element formation surface 20S. Because other features of the magnetic sensor 10P are identical to those of the magnetic sensor 10I according to the ninth embodiment, the same elements are denoted by the same reference characters and redundant explanations thereof will be omitted.

The protection member 70 is made of a lower-permeability material than that of the first to third magnetic members 31 to 33, such as resin. The protection member 70 is provided to cover the element formation surface 20S to seal the first to third magnetic members 31 to 33 and to fill spaces located between the first to third magnetic members 31 to 33. Provision of the protection member 70 enables the first to third magnetic members 31 to 33 to be protected physically without lowering the detection sensitivity.

It is apparent that the present invention is not limited to the above embodiments, but may be modified and changed without departing from the scope and spirit of the invention.

REFERENCE SIGNS LIST 10A-10P: magnetic sensor
20: sensor chip
20S: element formation surface
21: substrate
22: insulating layer
31: first magnetic member
32: second magnetic member
33: third magnetic member
40: soft magnetic member
41: permanent magnet
42: sensor module
49: disturbance magnetic field
51: constant-voltage source
52: voltage detection circuit
61: signal processing circuit
62: magnetic-field generation circuit
70: protection member
E11-E14: terminal electrode
MR1-MR4: magnetic detection element
ø: magnetic flux

What is claimed is:

1. A magnetic sensor comprising:
a sensor chip having an element formation surface on which a first magnetic detection element and a second magnetic detection element are formed;
a first magnetic member placed on the element formation surface and having a first height as a height from the element formation surface; and
a second magnetic member located on an opposite side of the first magnetic detection element relative to the first magnetic member and having a second height lower than the first height,
wherein the second magnetic member is placed on the element formation surface, and
wherein the first and second magnetic members are larger in size in a length direction than in a width direction, the width direction being an array direction of the first and second magnetic detection elements and the length direction being parallel to the element formation surface and orthogonal to the width direction.

2. The magnetic sensor as claimed in claim 1, wherein the first magnetic member is placed between the first magnetic detection element and the second magnetic detection element.

3. The magnetic sensor as claimed in claim 1, wherein the size in the length direction of at least one of the first and second magnetic members is larger than the size in the length direction of the sensor chip.

4. The magnetic sensor as claimed in claim 1, wherein the sizes in the length direction of the first and second magnetic members are different from each other.

5. The magnetic sensor as claimed in claim 1, wherein the sizes in the width direction of the first and second magnetic members are different from each other.

6. The magnetic sensor as claimed in claim 1, wherein the second magnetic member is divided in the length direction into a plurality of parts.

7. The magnetic sensor as claimed in claim 1, wherein a distance in the width direction between the first magnetic detection element and the second magnetic member is larger than a distance in the width direction between the first magnetic detection element and the first magnetic member.

8. The magnetic sensor as claimed in claim 1, wherein a distance in the width direction between the first magnetic detection element and the first magnetic member and a distance in the width direction between the first magnetic detection element and the second magnetic member is equal to each other.

9. The magnetic sensor as claimed in claim 1, wherein the magnetic sensor is configured to detect a residual magnetic field in a magnetic medium moving in the width direction relative to the sensor chip.

10. The magnetic sensor as claimed in claim 1, further comprising a third magnetic member located on an opposite side of the second magnetic detection element to the first magnetic member and having a third height lower than the first height.

11. The magnetic sensor as claimed in claim 1, further comprising a protection member that is configured to fill a space between the first magnetic member and the second magnetic member, that seals the first and second magnetic members, and that has a lower permeability than that of the first and second magnetic members.

12. A magnetic-field detection device comprising:
the magnetic sensor as claimed in claim 1, and
a signal processing circuit configured to extract a predetermined frequency component from an output signal of the magnetic sensor.

13. The magnetic-field detection device as claimed in claim 12, further comprising a magnetic-field generation circuit configured to apply a cancel magnetic field to the magnetic sensor based on a cancel signal generated based on the predetermined frequency component.

14. The magnetic sensor as claimed in claim 1, wherein the element formation surface extends in a first direction and a second direction perpendicular to the first direction.

15. A magnetic sensor comprising:
a sensor chip having a main surface extending in a first direction and a second direction perpendicular to the first direction; and
first and second magnetic members placed on the main surface via an insulating layer,
wherein the sensor chip includes a first magnetic detection element and a second magnetic detection element on the main surface,
wherein the first and second magnetic members are larger in size in the first direction than the second direction, the second direction being an array direction of the first and second magnetic detection elements;

wherein the magnetic detection element is located between the first and second magnetic members viewed from a third direction perpendicular to the first and second directions, and wherein the second magnetic member is lower in height in the third direction than the first magnetic member.

16. The magnetic sensor as claimed in claim 15, wherein the sensor chip further has a first side surface extending in the first and third directions and a second side surface extending in the second and third directions, and wherein each of the first and second side surfaces is free from the first and second magnetic members.

17. The magnetic sensor as claimed in claim 15, wherein at least one of the first and second magnetic members is larger in the first direction than the main surface, thereby a part of at least the one of the first and second magnetic members does not overlap with the main surface.

* * * * *